United States Patent
Roberts

(10) Patent No.: US 11,561,111 B2
(45) Date of Patent: Jan. 24, 2023

(54) DISPLACEMENT SENSING

(71) Applicant: TouchNetix Limited, Fareham (GB)

(72) Inventor: Stephen William Roberts, Fareham (GB)

(73) Assignee: TouchNetix Limited, Fareham (GB)

( * ) Notice: Subject to any disclaimer, the term of this patent is extended or adjusted under 35 U.S.C. 154(b) by 150 days.

(21) Appl. No.: 17/058,477

(22) PCT Filed: May 28, 2019

(86) PCT No.: PCT/GB2019/051452
§ 371 (c)(1),
(2) Date: Nov. 24, 2020

(87) PCT Pub. No.: WO2019/229425
PCT Pub. Date: Dec. 5, 2019

(65) Prior Publication Data
US 2021/0199465 A1 Jul. 1, 2021

(30) Foreign Application Priority Data
Jun. 1, 2018 (GB) .................................... 1808984

(51) Int. Cl.
*G01D 3/036* (2006.01)
*G01D 5/241* (2006.01)
(Continued)

(52) U.S. Cl.
CPC ......... *G01D 3/0365* (2013.01); *G01D 5/2417* (2013.01); *G06F 3/0416* (2013.01); *G06F 2203/04105* (2013.01)

(58) Field of Classification Search
USPC ....................................................... 702/104
See application file for complete search history.

(56) References Cited

U.S. PATENT DOCUMENTS

2010/0045612 A1* 2/2010 Molne .................... G06F 3/016
345/173
2010/0060604 A1* 3/2010 Zwart ................... G06F 1/1626
345/173
(Continued)

FOREIGN PATENT DOCUMENTS

EP 1868068 A1 12/2007

OTHER PUBLICATIONS

International Search Report and Written Opinion for corresponding International Patent Application No. PCT/GB2019/051452 dated May 28, 2019.
(Continued)

*Primary Examiner* — Chineyere D Wills-Burns
(74) *Attorney, Agent, or Firm* — Renner, Otto, Boisselle & Sklar, LLP

(57) ABSTRACT

A sensing apparatus comprising a displacement sensor element arranged to sense a separation between a first element (2) and a second element (3) movably mounted with respect to the first element; an acceleration sensor element configured to sense an acceleration associated with the first element; displacement measurement circuitry (4A) configured to make a measurement indicative of separation on the basis of the sensed separation; acceleration measurement circuitry (4C) configured to make a measurement of acceleration on the basis of the sensed acceleration; and a processing element (4D) configured to output a signal to indicate there is determined to be a change in the separation of the second element relative to the first element on the basis of the measurement indicative of separation and the measurement of acceleration.

14 Claims, 9 Drawing Sheets

(51) Int. Cl.
*G06F 3/041* (2006.01)
*H03K 17/96* (2006.01)

(56) References Cited

U.S. PATENT DOCUMENTS

| | | | |
|---|---|---|---|
| 2011/0012869 A1 | 1/2011 | Klinghult | |
| 2011/0057904 A1* | 3/2011 | Yamano | H01G 5/16 |
| | | | 345/174 |
| 2011/0227872 A1 | 9/2011 | Huska | |
| 2011/0248948 A1* | 10/2011 | Griffin | G06F 3/0488 |
| | | | 345/174 |
| 2012/0086666 A1* | 4/2012 | Badaye | G06F 3/0446 |
| | | | 345/174 |
| 2012/0188200 A1* | 7/2012 | Roziere | G06F 3/041661 |
| | | | 345/174 |
| 2013/0076375 A1* | 3/2013 | Hanumanthaiah | H03K 17/955 |
| | | | 324/661 |
| 2013/0257714 A1* | 10/2013 | Suzuki | G06F 3/016 |
| | | | 345/156 |
| 2013/0257784 A1* | 10/2013 | Vandermeijden | G06F 3/0447 |
| | | | 345/174 |
| 2015/0199061 A1* | 7/2015 | Kitada | G06F 3/04182 |
| | | | 345/173 |
| 2017/0017346 A1 | 1/2017 | Gowreesunker | |
| 2017/0090660 A1* | 3/2017 | Miyata | G06F 3/0346 |
| 2017/0153737 A1* | 6/2017 | Chawda | G06F 3/0418 |
| 2017/0219330 A1* | 8/2017 | Sleeman | G01B 7/14 |
| 2017/0315600 A1* | 11/2017 | Chen | H04M 1/72454 |
| 2018/0081613 A1* | 3/2018 | Masuike | G09G 5/003 |
| 2018/0088702 A1* | 3/2018 | Shutzberg | G06F 1/1656 |

OTHER PUBLICATIONS

United Kingdom Combined Search and Examination Repod for corresponding GB Application No. GB1808984.7 dated Dec. 7, 2018.

* cited by examiner

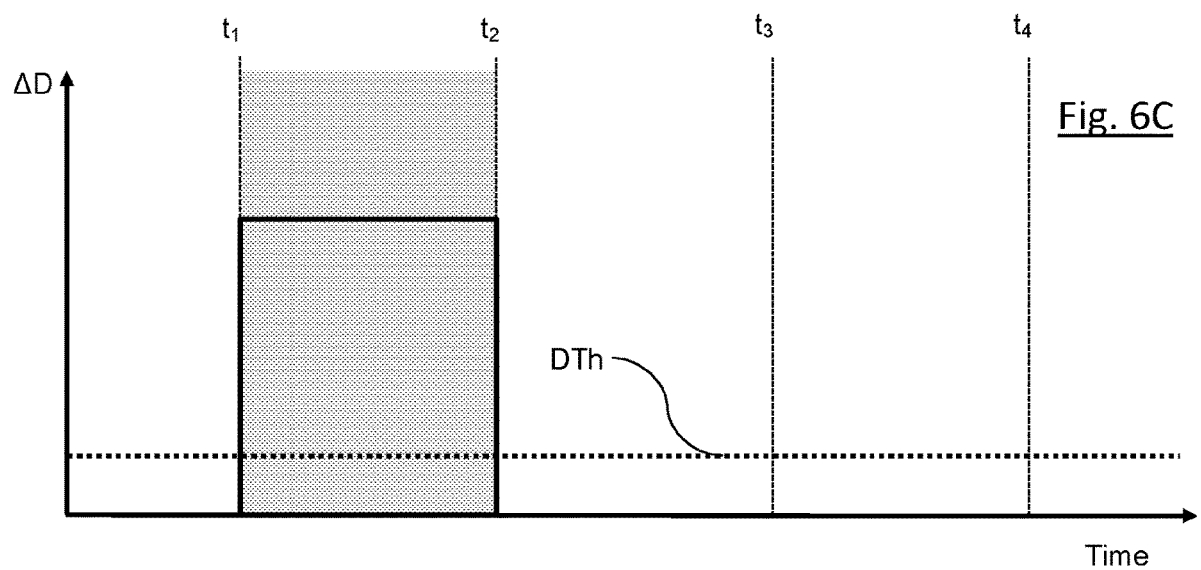

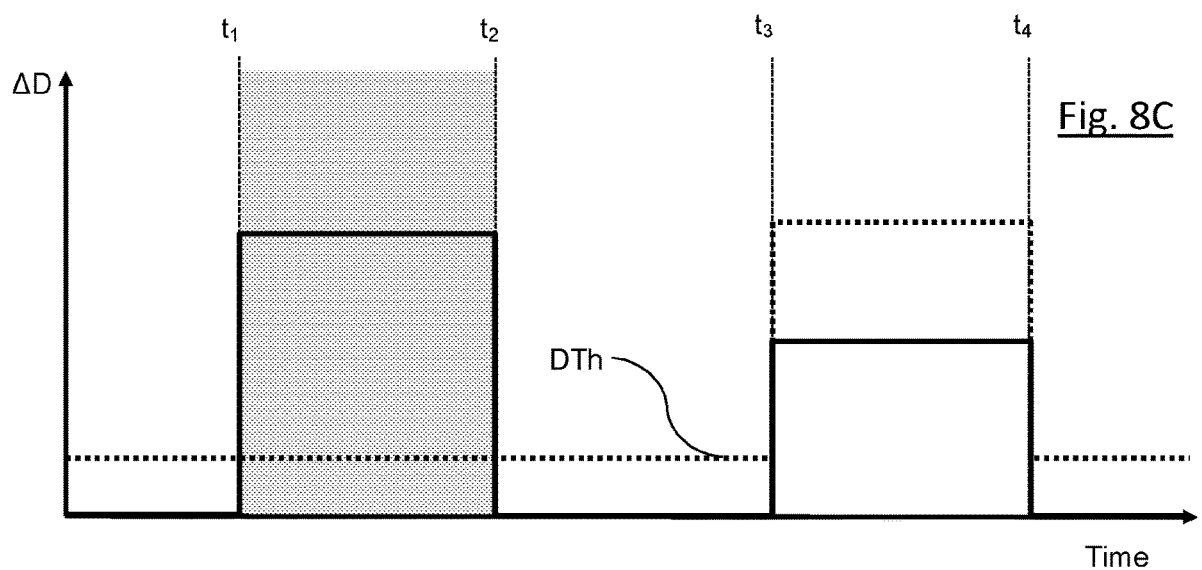

DISPLACEMENT SENSING

This application is a national phase of International Application No. PCT/GB2019/051452 filed May 28, 2019 which claims priority from GB Application No. 1808984.7 filed Jun. 1, 2018 and published in the English language, all of which are incorporated by reference.

BACKGROUND OF THE INVENTION

The present invention relates to displacement sensing.

Capacitive sensing techniques have become widespread for providing touch-sensitive inputs, for example in computer tablets, mobile phones, and in many other applications. Touch sensitive input devices are generally perceived to be more aesthetically pleasing than input devices that are based on mechanical switches. Nonetheless, the present inventors have recognised there are still situations in which a user-interface that is responsive to mechanical input may be desired. In particular, the inventors have recognised there are situations in which there is a desire to measure the physical displacement of a displaceable element, for example to provide the equivalent of a "click" when navigating a cursor across a display screen using a touch sensor.

One issue with determining a user input by sensing displacement of a displacement element is the potential for physical perturbations other than user inputs to impact the measurements that are made to determine when a displacement has occurred. For example, one simple way to measure a displacement of a displacement element is to measure a change in separation distance between this element and a 'reference' element that is assumed to be at rest. However, if the reference element undergoes a change in velocity, i.e. due to a mechanical perturbation of a device containing the sensor apparatus, it can be difficult to determine if a sensed change in separation distance between the displacement and reference elements should be considered to correlate with a user input displacing the displacement element (i.e. by pressing it) or if the change in separation distance results from inertial effects associated with the acceleration of the reference element. For example, if the reference element is coincident with or mechanically coupled to an external housing of a device containing the displacement element, which may in some cases be a touch sensitive input, and the housing is moved suddenly, the separation distance between the reference element and the displacement element may change despite the user making no deliberate inputs to the displacement element.

There is therefore a desire for apparatus and methods that can help to address these kinds of issues.

SUMMARY OF THE INVENTION

The present disclosure can help address or mitigate at least some of the issues discussed above.

Respective aspects and features of the present disclosure are defined in the appended claims.

It is to be understood that both the foregoing general description and the following detailed description are exemplary, but are not restrictive, of the present technology. The described embodiments, together with further advantages, will be best understood by reference to the following detailed description taken in conjunction with the accompanying drawings.

BRIEF DESCRIPTION OF THE DRAWINGS

The invention is now described by way of example only with reference to the following drawings in which:

FIGS. 6A to 6C are graphs schematically representing some aspects of an approach to detecting when a displacement occurs using the sensing apparatus of FIGS. 1 to 4 in accordance with certain embodiments of the disclosure;

FIGS. 8A to 8C are graphs schematically representing some aspects of an alternative approach to detecting when a displacement occurs using the sensing apparatus of FIGS. 1 to 4 in accordance with certain embodiments of the disclosure.

DETAILED DESCRIPTION

Figure 1:
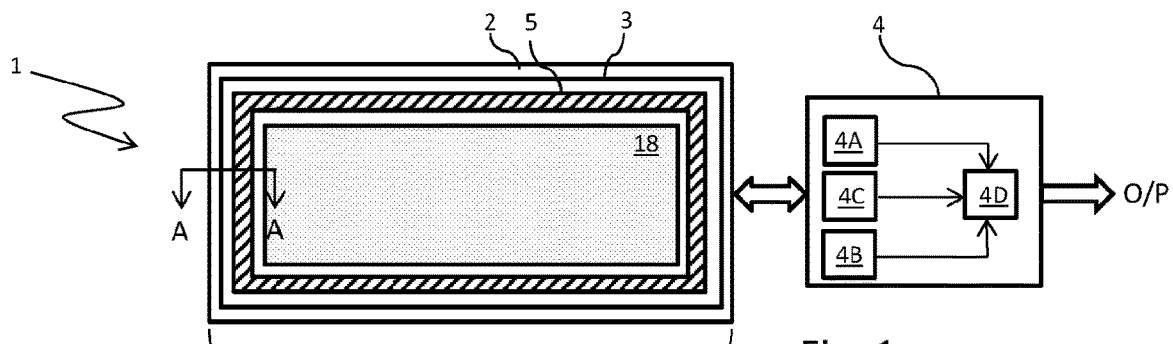
FIG. 1 schematically represents a sensor element and controller element of a sensing apparatus according to certain embodiments of the invention.

Aspects and features of certain examples and embodiments of the present invention are discussed/described herein. Some aspects and features of certain examples and embodiments may be implemented conventionally and these are not discussed/described in detail in the interests of brevity. It will thus be appreciated that aspects and features of apparatus and methods discussed herein which are not described in detail may be implemented in accordance with any conventional techniques for implementing such aspects and features.

FIGS. 1, 2, 3 and 4 schematically represent various aspects of a sensing apparatus 1 in accordance with certain embodiments of the invention. The sensing apparatus 1 comprises a displacement element 3 (sometimes referred to herein as a second element) that is movably mounted with respect to a frame element 2 (sometimes referred to herein as a first element). In some embodiments, the displacement element 3 comprises a substrate, e.g. formed from glass or plastic, and a touch sensitive element 18 mounted thereon. In this embodiment, the sensing apparatus 1 is operable to measure both a displacement of the displacement element 3 and the presence of an object over/touching the displacement element 3 using capacitive sensing techniques.

Overall the sensing apparatus 1 comprises two main functional parts, the sensor element 6 and the controller element 4. The sensor element 6 comprises the displacement element 3 and associated components for capacitively measuring displacements and touches applied to the displacement element 3. The sensor element 6 additionally comprises an acceleration sensor element 9 and associated components for measuring the acceleration state of the sensing apparatus 1. In this embodiment, the acceleration sensor element 9 is mechanically coupled to the frame element 2 and is configured to sense the acceleration of the frame element 2. The controller element 4 comprises capacitance measurement circuitry 4A and 4B for measuring capacitances indicative of displacements and touches applied to the sensing element 6, respectively, acceleration measurement circuitry 4C for measuring input signals indicative of the acceleration state of the frame element 2, and processing circuitry 4D (sometimes referred to herein as a processor element) for processing the capacitance and acceleration measurements. The controller element 4 may be implemented in software or on one or more dedicated pieces of hardware, e.g., ASICs, field programmable gate arrays, etc., as would be appreciated by the skilled person.

The sensor element 6 comprises displacement sensing electrodes 5 and 12 for use in detecting displacements of the moveably mounted displacement element 3 with respect to the frame element 2 based on capacitive coupling measurements associated with the displacement sensing electrodes. The displacement sensing electrodes 5 and 12 collectively form a displacement sensor element. These capacitive coupling measurements are made using displacement element measurement circuitry 4A within the controller element 4. The configuration of displacement sensing electrodes 5, 12, displacement element measurement circuitry 4A, and the touch element capacitance measurement circuitry 4B for measuring capacitive couplings associated with the touch sensitive element 18 may be based on any conventional techniques for capacitance-based displacement sensing. In this example it is assumed the displacement element measurement circuitry 4A is configured to provide an output signal to the processing circuitry 4D which comprises an indication of a measured strength of a capacitive coupling between the displacement sensing electrodes in accordance with known techniques.

The touch sensitive element 18 for the sensor element 6 comprises an arrangement of touch sensing electrodes (not shown in the figures) for use in detecting when there is an object touching or adjacent the displacement element 3 based on capacitive coupling measurements associated with the touch sensing electrodes. These capacitive coupling measurements are made using touch element capacitance measurement circuitry 4B within the controller element 4. In this example the touch sensitive element 18 and associated touch element capacitance measurement circuitry 4B provide a position-sensitive touch sensor, i.e. a touch sensor configured to detect both the presence and also the position of an object (or positions for multiple objects for a multi-touch sensor) over the displacement element. In other examples the touch sensor functionality of the sensing apparatus may simply provide an indication of whether or not there is an object in a touch-sensitive region of the touch sensitive element without any position information. The arrangement of touch sensing electrodes on the displacement element 3 and the touch element capacitance measurement circuitry 4B for measuring capacitive couplings associated with the touch sensitive element may be in accordance with any conventional approaches for touch sensing. In this example it is assumed the touch element capacitance measurement circuitry 4B is configured to provide an output signal to the processing circuitry 4D which comprises an indication of a measured strength and location of a capacitive coupling associated with the presence of an object touching or adjacent the touch sensitive element in accordance with known techniques.

The acceleration sensor element 9 is configured to sense when there is a change in velocity of the acceleration sensor element 9. Acceleration measurements are made using acceleration element measurement circuitry 4C within the controller element 4, which is coupled to the output of the acceleration sensor element 9. In this example, the acceleration sensor element 9 is mechanically coupled to the frame element 2 such that the output of the acceleration sensor element 9 provides an indication of the acceleration state of the frame element 2. The configuration of acceleration sensor element 9 and the acceleration element measurement circuitry 4C for measuring acceleration associated with the acceleration sensor element may be based on any conventional techniques for acceleration sensing. For example, capacitative, piezoresistive, electromagnetic, piezoelectric, ferroelectric and optical approaches to acceleration measurement are known in the art. What is significant for the purposes of this disclosure is not the specific technique used to sense acceleration, but that the acceleration sensor element 9 is able to provide a measure of the acceleration state to which it is subjected. In this example it is assumed the acceleration element measurement circuitry 4C is configured to provide an output signal to the processing circuitry 4D which comprises an indication of the acceleration state of frame element 2 in accordance with known techniques.

Thus the sensing apparatus of FIG. 1 includes a displacement sensing function for detecting a displacement of the touch-sensitive displacement element 3, a touch sensing function for detecting the presence (and in this example also the position) of an object touching or adjacent the touch-sensitive displacement element 3, and an acceleration sensing function for detecting the acceleration of the frame element 2.

The displacement sensing function is provided by the displacement sensing electrodes 5, 12 and associated displacement element capacitance measurement circuitry 4A in the controller element 4. Together the displacement element 3, displacement sensing electrodes 5, 12, and the displacement element capacitance measurement circuitry 4A may thus be considered a displacement sensor with an output that provides an indication of the degree of capacitive coupling between the displacement sensing electrodes. The degree of capacitive coupling is a function of the separation distance between the displacement element 3 and the frame element 2. More generally, the output of the displacement sensor may be considered a signal that is representative of the separation distance.

The touch sensing function is provided by the touch sensing electrodes of the touch sensitive element 18 and associated touch element capacitance measurement circuitry 4B in the controller element 4. Together the touch sensitive element 18 with its touch sensing electrodes and the touch element capacitance measurement circuitry 4B may thus be considered a touch sensor with an output that provides an indication of the degree of capacitive coupling and position associated with an object, e.g. a user's finger, touching or adjacent the displacement element (in particular touching or adjacent the touch sensitive element 18 of the displacement element).

The acceleration sensing function is provided by the acceleration sensor element 9 and associated acceleration element measurement circuitry 4C in the controller element 4. Together the acceleration sensor element 9 and the acceleration element measurement circuitry 4C may thus be considered an acceleration sensor with an output that provides an indication of the acceleration state of the frame element 2.

As noted above, the specific configurations for the displacement sensor component, the acceleration sensor component, and the touch sensor component in terms of their structure and their measurement circuitry may be based on conventional approaches. Moreover, the inclusion of a touch sensor component disposed upon or within the displacement element is not of primary significance to the principles described herein. In accordance with certain embodiments of the disclosure, new approaches are provided comprising acceleration and displacement sensing, and processing of the outputs from displacement element measurement circuitry 4A and the acceleration sensor element measurement circuitry 4C to assist in determining whether displacements of a displacement element 3 relative to a frame element 2 result from a user-applied input force on the displacement element 3 or from inertial effects associated with acceleration of the frame element 2. In this sense the specific implementations for the displacement sensor, touch sensor and acceleration sensor are not of primary significance to the principles described herein, but rather what is more significant in accordance with certain embodiments of the disclosure is how the outputs from a displacement sensor and an acceleration sensor (i.e. the outputs from their respective output measurement circuitry 4A, 4C) are processed, for example, in the processing circuitry 4D. It will be appreciated that though the embodiments described include a touch sensor component associated with displacement element 3, this is not fundamental to the principles of the present disclosure; that is, in some implementations, the touch sensor component is optional.

Figure 2:
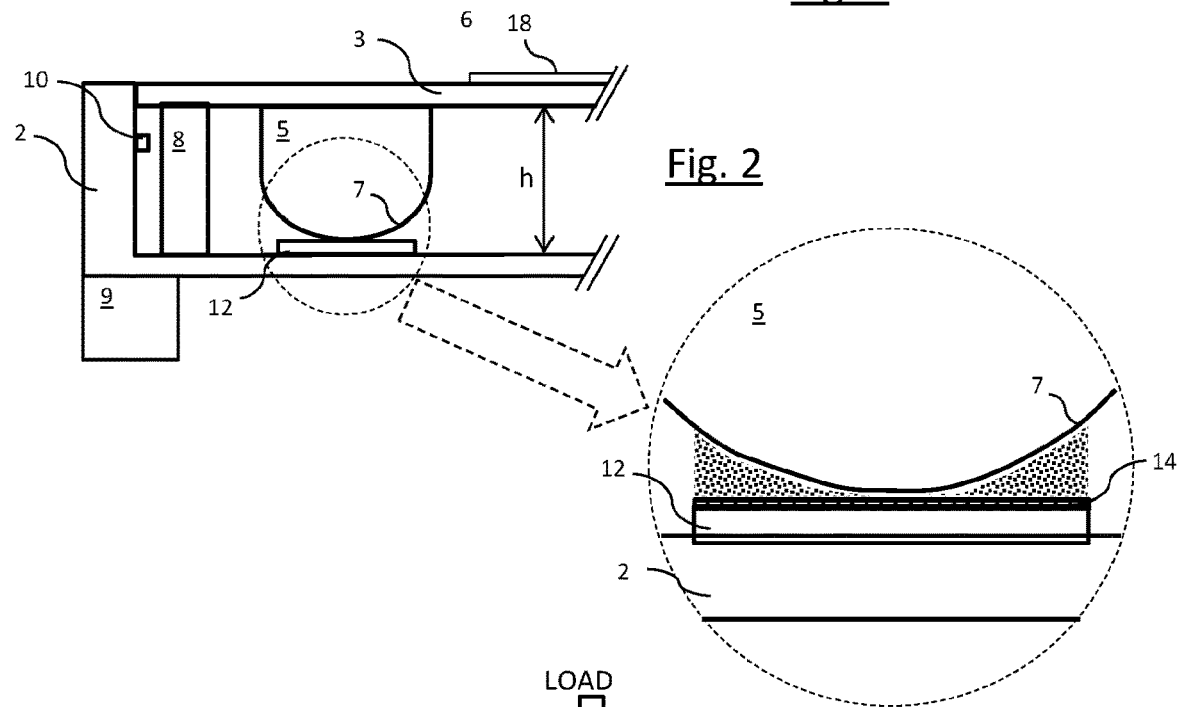
FIG. 2 schematically shows in cross-section a portion of the sensing apparatus of FIG. 1 in a non-displaced state.
Figure 3:
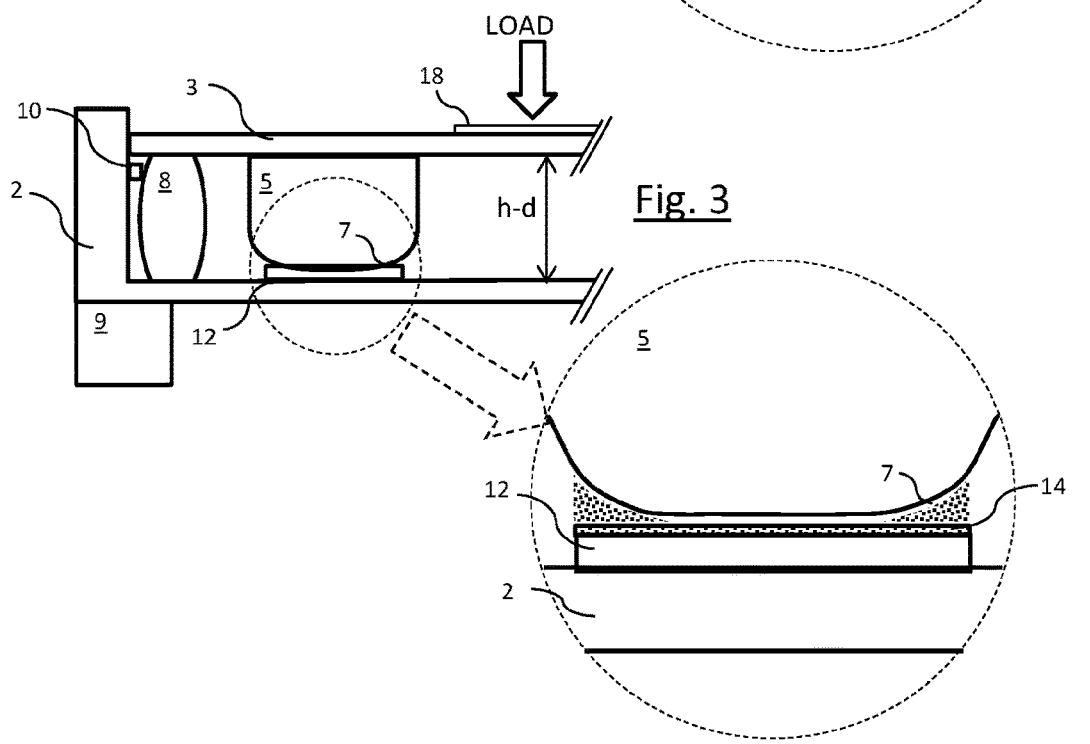
FIGS. 3 and 4 schematically show in cross-section a portion of the sensing apparatus of FIG. 1 in displaced states resulting from two different loading scenarios.
Figure 4:
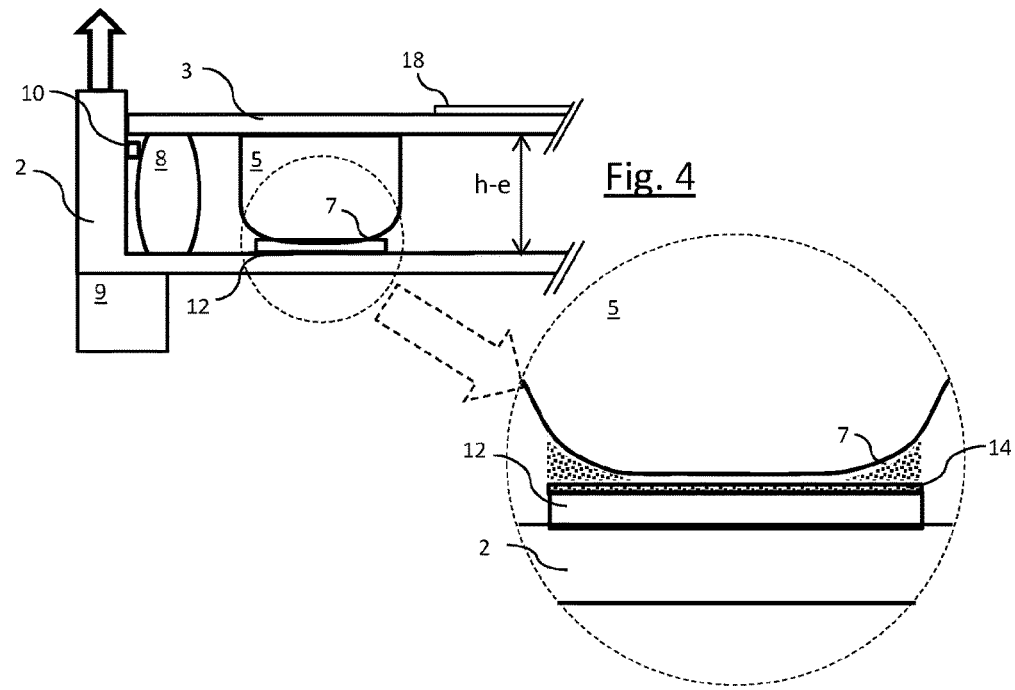

Having set out some of the operating principles for sensing apparatus in accordance with certain embodiments, the specific sensing device implementation comprising displacement sensing, acceleration sensing and touch sensing represented in FIGS. 1 to 4 will now be described in more detail. FIG. 1 schematically represents the sensor element 6 in plan view and the controller element 4 in highly schematic form (i.e. as a functional block). FIGS. 2, 3 and 4 respectively show portions of the sensor element 6 of the sensing apparatus 1 in cross-section (taken on the line A-A represented in FIG. 1), with FIG. 2 showing the sensing apparatus 1 in a non-displaced (rest) state, FIG. 3 showing the sensing apparatus 1 in a displaced state due to user input of force (load) upon displacement element 3, and FIG. 4 showing the sensing apparatus in a displaced state due to inertial effects associated with acceleration of the frame element 2.

The sensing apparatus 1 is arranged to measure displacement of the displacement element 3 relative to the frame element 2, for example in response to a user pressing on or otherwise applying a displacement load to the displacement element 3. In this embodiment, the displacement sensor function is based on measuring changes in capacitive coupling associated with a deformable electrode 5 and a reference electrode 12 arranged between the displacement element 3 and frame element 2 (the deformable electrode and reference electrode are the displacement sensing electrodes discussed above). This capacitive coupling is measured by the displacement element measurement circuitry 4A, for example using conventional capacitive measurement techniques. Displacement of the displacement element 3 relative to the frame element 2 causes a change in the capacitive coupling between the deformable electrode 5 and the reference electrode 12 as the deformable electrode 5 deforms under the displacement load. It will be appreciated the use of capacitive sensing technologies to detect displacement may be convenient in certain implementations in that similar controller technologies can be used for sensing displacement and for sensing the presence and positions of objects adjacent the displacement element 3. Also, a capacitive-based displacement sensing approach can be configured to provide an indication of a degree of displacement, as opposed to a simple binary detection. This can be useful in some cases, for example, to allow changes in a desired threshold for establishing when a displacement is deemed to have occurred. For example, the sensitivity to detect displacement may be adjusted by simply changing the threshold at which a displacement is considered to have occurred. Thus, if it is desired that a relatively light touch should be recognised as a displacement, a relatively low threshold can be set, whereas if it is desired that a relatively heavy touch is needed to be considered a displacement, a relatively high threshold could be set. However, as already noted it will be appreciated the specific displacement sensing technology is not significant in the principles described herein and in other implementations other types of displacement sensing technology may be used.

The displacement element 3 is the part of sensor apparatus 1 to which a load may be applied during normal use. The application of an example load during use, e.g. corresponding to a user pressing a finger or stylus on the displacement element 3, is schematically shown in FIG. 3 by the arrow labelled "LOAD". For ease of explanation, the side of the displacement element 3 to which the load is applied in normal use may sometimes be referred to herein as the "upper" or "outer" side of the displacement element 3 (or similar terminology such as "top"), with the other side being referred to as "lower" or "inner" (or similar terminology, such as "bottom"). Thus, the surface of the displacement element 3 shown uppermost in the orientation of FIGS. 2, 3 and 4 may sometimes be referred to as the upper/outer/top surface of the displacement element 3. Likewise, the lowermost surface of the displacement element 3 for the orientation of FIGS. 2, 3 and 4 may sometimes be referred to as the bottom/lower/inner surface. Corresponding terms may similarly be used in respect of other parts of the sensing apparatus 1 in accordance with the orientation shown in the relevant figures. However, it will be appreciated this terminology is used purely for convenience of explanation and is not intended to suggest a particular orientation of the sensing apparatus 1 should be adopted in normal use. For example, although in the orientation of FIGS. 2, 3 and 4 the upper surface of the sensor element 6 is shown uppermost, the sensor element 6 could equally be used in a downward facing configuration, or facing outwards from a vertical surface, according to the implementation at hand. More generally, the sensing apparatus 1 may be incorporated in a portable device (such as a tablet computer or mobile telephone), and in that case the orientation in use will vary according to how a user happens to be holding the device.

The frame element 2 provides a structural support for the displacement element 3 and will typically be connected to, or comprise an integral part of, an apparatus in which the sensing apparatus 1 is provided. The frame element 2 may comprise any suitable structural material, for example it may be formed from metal or plastic. The frame element 2 in this example defines a recess/opening into which the displacement element 3 is received and moveably supported therein by a support element 8 arranged around a peripheral part of the displacement element 3. In this example the movable mounting of the displacement element 3 relative to the frame element 2 is provided by virtue of the support element 8 comprising a resiliently compressible material. An upper edge of the support element 8 is bonded to the underside of the displacement element 3 and a lower edge of the support element 8 is bonded to the frame element 2. Conventional bonding techniques can be used for bonding the support element 8 to the other parts of the sensing apparatus 1, for example having regard to bonding techniques appropriate for the materials involved.

The support element 8 in this example is thus generally in the form of a rectangular ring arranged around a peripheral part of the displacement element 3. The support element 8 has a generally rectangular cross-section when in its relaxed state (as shown in FIG. 2), although when the support element 8 is compressed by virtue of a load being applied to the displacement element 3, its sides may bow out to accommodate the movement, as schematically indicated in FIG. 3. It will, however, be appreciated that other shapes could be used in accordance with established mounting practices. For example, more complex shapes for the support element 8 may be chosen to provide different degrees of compressibility according to the degree to which the support element is already compressed. The frame element 2 may include a stop to limit the extent to which the support element 8 may be compressed (i.e. to limit the extent to which the displacement element may be displaced relative to the frame element 2). In this example such a stop is provided by a suitably arranged protrusion 10 from a side wall of the recess defined by the frame element 2. This protrusion 10 may extend all around the recess or may be provided at a number of discrete locations around the recess.

The support element 8 in this example comprises an elastomeric material having an appropriate degree of rigidity and compressibility according to the application at hand (i.e. providing a desired level of resistance to compression). In some cases there may be a desire for a material having relatively low compressibility, thereby requiring a relatively high load to generate a given displacement of the displacement element 3 relative to the frame element 2. Conversely, in some cases there may be a desire for a material having relatively high compressibility, thereby requiring a relatively low load to generate a given displacement of the displacement element 3 relative to the frame element 2. This will be a question of design choice. For example, in the context of a displacement sensor forming a user interface a designer may choose how hard the user must press to cause a given displacement. This may be done, for example, to balance the risk of accidental activation against requiring too great a force for activation. A material having the desired degree of compressibility may be selected from modelling or empirical testing, for example.

With reference to FIGS. 2, 3 and 4, the deformable electrode 5 is arranged between the displacement element 3 and the frame element 2 and follows a generally rectangular path around (i.e. within and adjacent to) a peripheral region of the displacement element 3. The deformable electrode 5 has a generally "D" shaped cross-section with a lower curved wall 7, which may also be referred to as a contact surface 7 for the deformable electrode 5. The specific geometry of the deformable electrode 5, e.g. in terms of its cross-sectional size, separation from the peripheral edge of the displacement element 3, and the extent to which it extends around the whole periphery, is not significant to the principles described herein and may vary depending on the specific construction of the sensing apparatus 1.

The deformable electrode 5 may be formed in a number of different ways. In this example the deformable electrode 5 is comprised of suitably profiled elastomeric conductive foam; however, other materials may also be used. An electrical connection to the deformable electrode 5 to allow for the measurements discussed further below may be made using one or more conductors in contact with the deformable electrode 5.

Between the deformable electrode 5 and the frame element 2 is the reference electrode 12. The reference electrode 12 is generally in alignment with the deformable electrode 5 and follows a corresponding path beneath the deformable electrode 5. An upper surface of the reference electrode 12 is provided with an electrical insulator layer 14 (shown schematically in the magnified parts of FIGS. 2, 3 and 4). The insulator layer 14 prevents the overlying deformable electrode 5 from coming into direct electrical contact with the reference electrode 12 when the deformable electrode 12 is pressed against the reference electrode 12 during displacement of the displacement element 3 towards the frame element 2.

The reference electrode 12 may be provided in a number of different ways, for example as a conductive trace deposited on the frame element 2. The insulator layer 14 may also be provided in a conventional manner, for example comprising a plastic film or layer of plastic/resin encapsulant over the reference electrode 12. It will, however, be appreciated that different techniques can be used in different implementations. Although the reference electrode 12 is schematically represented in FIGS. 2, 3 and 4 as being disposed on top of the frame element 2, in other examples the reference electrode may be embedded within the frame element 2. If the frame element 2 is conductive, the reference electrode 12 may be insulated therefrom. It will be appreciated the reference electrode 12 and insulator layer 14 might typically be relatively thin compared to the other elements of the sensor element 6 shown in FIGS. 2, 3 and 4, but these figures are not drawn to scale, with the reference electrode 12 (and its layer of insulation 14) shown with exaggerated thickness in the cross-sections of FIGS. 2, 3 and 4 for ease of representation.

As noted above, FIG. 2 schematically represents the sensor element 6 in a rest state with no displacement load applied to the displacement element 3. In this example the gap between the upper surface of the frame element 2 and a lower surface of the displacement element 3 is, as indicated in FIG. 2, h. This gap h corresponds with the height of the support element 8 in its relaxed state. In this example the support element 8 is sized to provide a gap h that is slightly less than the height of the deformable electrode 5, such that the deformable electrode 5 is in slight compression so there is a portion of its contact surface 7 for which there is no free space (air gap) between the deformable electrode 5 and the frame element 2, even when in the rest (non-displaced) state.

FIG. 3 schematically represents the sensor element 6 in a displaced state in which a displacement load is applied to the displacement element 3. The displacement load may, for example, be provided by a users finger pressing on the outer surface of the displacement element 3. The support element 8 and the deformable electrode 5 are both compressed under the action of the displacement load allowing the displacement element 3 to move along a displacement direction towards the frame element 2 by an amount d. The magnitude of the displacement d will be a function of the force (load) applied and the combined resilience of the support element 8 and the deformable electrode 5. The displacement element 3 in FIG. 3 is schematically shown as remaining parallel to the frame element when displaced, but in general it may be expected the displacement element 3 may be tilted depending on the location of the load (i.e. the value of d may be different at different positions across the displacement element 3). In this example the magnitude of the displacement is assumed to be around 0.1 cm.

As a consequence of the deformable electrode 5 being compressed under the displacement load, the curved contact surface 7 is pressed harder against the underlying insulator layer 14. This causes the contact surface 7 to flatten against the insulator layer 14, thereby reducing the overall volume between the deformable electrode 5 and the reference electrode 12 as compared to the rest state represented in FIG. 2. The space between the deformable electrode 5 and the reference electrode 12 is schematically shown with shading in FIGS. 2 and 3, and it can be seen how the shading in FIG. 3 occupies a smaller area than the shading in FIG. 2.

Because the volume of the space between the deformable electrode 5 and the reference electrode 12 is reduced under the displacement load, the capacitive coupling between the deformable electrode 5 and the reference electrode 12 increases when the displacement load is applied. The controller element 4, and in particular the displacement element measurement circuitry 4A, is configured to measure a characteristic of the capacitive coupling associated the two electrodes, thereby allowing a determination to be made as to whether a displacement has occurred. By way of example only, a displacement may be deemed to occur if the separation distance h-d is smaller than or equal to a threshold value (or alternatively, the change in separation distance d is greater than or equal to a threshold value). Connections between the displacement measurement circuitry 4A and the respective electrodes can be established in accordance with conventional techniques, for example using appropriate wiring. There are various different ways in which a characteristic of the capacitive coupling between the two electrodes can be measured. For example, the mutual capacitive coupling between the two electrodes could be measured by applying a drive signal to one of the electrodes and measuring the extent to which the drive signal is coupled to the other of the electrodes. Alternatively, the self-capacitance of one of the electrodes could be measured with respect to a reference potential whilst the other electrode is connected to the reference potential (e.g. a system ground or other system reference potential). For simplicity the system reference potential may sometimes be referred to herein as a system ground or earth, but it will be appreciated the actual potential itself may be arbitrary and is not significant (e.g. it could be 0V, 5V or 12V, or any other value according to the implementation at hand). In yet another example, one of the electrodes may comprise two components which are capacitively coupled to one another. For example the reference electrode 12 of FIGS. 1 to 4 may be replaced with a reference electrode comprising a pair of parallel or interdigitated conductors which are insulated from one another but in a relatively close proximity on the frame element 2, with the gap between them underlying the deformable electrode 5. The mutual capacitive coupling between the two conductors comprising the reference electrode could be measured by applying a drive signal to one of the conductors and measuring the extent to which the drive signal is coupled to the other of the conductors. The component of the drive signal coupled between the electrodes will generally be reduced as the overlying deformable electrode is compressed on to them under the displacement load. Nonetheless, it will be appreciated the specific capacitive sensing technology used to detect changes in the capacitive coupling between the deformable electrode 5 and the reference electrode 12 is not significant to the principles described herein.

Turning now to the touch sensing function, the sensing apparatus 1 is configured to detect the presence of objects touching the touch sensitive element 18 of the displacement element 3 based on their effect on measurements of capacitive couplings associated with the touch sensing electrodes comprising the touch sensitive element. The touch sensitive element 18 of the displacement element 3 may be based on any known design, and may be constructed from a single layer or multiple, stacked layers, e.g., a one or more electrode layers comprising the touch sensor electrodes (depending on design) and a protective cover layer.

The touch sensor electrodes comprising the touch sensitive element 18 include a number of conductive traces or patches defining the touch sensitive area of the touch sensitive element 18. In this example it is assumed the touch sensitive area of the touch sensitive element extends across a centre region of the displacement element 3 to just inside the position of the deformable electrode 5. However, in other examples the sensitive area of the touch sensitive element may extend further across the surface of the displacement element 3, for example extending over the deformable electrode 5 and the support element 8. The touch sensor electrodes are electrically connected to the touch element capacitance measurement circuitry 4B in the controller element 4, which is configured to measure changes in capacitance couplings associated with the touch sensor electrodes caused by objects adjacent (e.g. touching) the touch sensitive element 18 of the displacement element 3. As will be appreciated there are many well-established techniques for capacitively sensing the positions of objects over a two-dimensional sensing surface, and any of these technologies may be adopted for the touch sensing function of the sensor element 6. In this regard, the specific pattern of electrodes/traces provided across the sensing surface and the associated capacitance measurement techniques provided by the touch element capacitance measurement circuitry 4B will depend on the specific sensing technology adopted. As is conventional, the touch sensor electrodes/traces may be made from any suitable conductive material, such as copper or transparent indium tin oxide (ITO). In some examples, the touch sensor electrodes may be arranged in a grid with overlapping horizontal (X) and vertical (Y) electrodes in a well-established configuration for capacitive sensing.

In essence, signalling associated with the touch sensor electrodes comprising the touch sensitive element 18 provides an indication of a degree of capacitive coupling between one or more objects overlying the touch sensitive element and the touch sensor electrodes. The specific nature of the signalling and the manner in which it indicates a degree of capacitive coupling will depend on the sensing technology adopted. The textbook "Capacitive Sensors: Design and Applications" by Larry K. Baxter, August 1996, Wiley-IEEE Press, ISBN: 978-0-7803-5351-0 [1] summarises some of the principles of conventional capacitive sensing techniques that may be used for measuring capacitance characteristics in accordance with various implementations. More generally, and as already noted, any established techniques for measuring indications of degrees of capacitive couplings between objects and a sensing surface could be adopted.

One example technique for measuring a degree of capacitive coupling uses so-called mutual capacitance measurement techniques. Mutual capacitance can be measured by applying a time varying drive signal to one electrode (e.g., a horizontal electrode) and measuring the extent to which the drive signal is capacitively coupled to another electrode (e.g., a vertical electrode) using conventional capacitance measurement techniques. The magnitude of the mutual capacitive coupling between the electrodes is influenced by the presence of nearby objects, e.g., human fingers. Changes in mutual capacitance measurements may therefore be considered to represent changes in capacitive couplings between nearby objects and the sensing surface.

Another example technique for measuring a degree of capacitive coupling uses so-called self-capacitance measurement techniques. Self-capacitance can be measured by determining the capacitance of an array of electrodes with respect to a reference potential. For example, the self-capacitance of a rectangular array of electrodes can be individually monitored. Changes in the measured self-capacitance for a particular electrode can be considered to represent a change in capacitive coupling between an object adjacent that particular electrode.

It should be understood that the above discussion sets out only some example ways in which capacitive sensing may be implemented for the sensing apparatus and it will be appreciated various other established techniques, or combination of established techniques, may be used for different implementations.

While in principle a capacitive displacement sensor can provide an indication of an amount of displacement, in many applications capacitive displacement sensors are used to provide a more straightforward binary indication as to whether or not a displacement element is to be considered as being displaced or not displaced. For example, this is typically the case in an implementation in which the displacement sensor is used to provide the same functionality of a simple mechanical button or switch, for example to provide a "click" function for a computer mouse trackpad or mobile phone display. Thus, in one application a mobile phone or other apparatus may have a user interface that includes a sensing apparatus of the kind discussed above overlaying a display screen. A user may press over the display screen at a desired location to indicate a selection of an underlying icon displayed on the display screen. The user's press may thus be detected using the displacement sensor function of the sensing apparatus and the location of the displacement press may be detected by the touch sensor function and together these may be interpreted by a controller for the apparatus in which the sensing apparatus is incorporated as a user selection of an operating function associated with the relevant icon. It will also be appreciated in some cases a displacement sensor may be configured to provide both a binary indication as to whether a displacement should be considered to have occurred and an indication of the size of the displacement. For example, the displacement sensor may be configured to both determine that at least a minimum amount displacement has occurred (i.e. a binary indication that there has been a displacement) and an indication of the magnitude of that displacement. This may be appropriate in an implementation in which the magnitude of the displacement is of interest, but there is a desire to avoid reporting the magnitude of the displacement for small displacements, for example which might be due to noise in the measurement circuitry or a user lightly resting their finger on a display element without actually wishing to indicate a press.

The displacement element 3 in this example is in the form of a planar rectangle, but other shapes may be used. The size of the displacement element 3 may be chosen according to the implementation at hand to provide the desired area over which a displacement load/force is to be detected. Purely for the sake of a specific example, it will be assumed here the displacement element 3 has a size of around 10 cm (width)×5 cm (height)×0.3 cm (thickness). The displacement element 3 in this example is formed generally of a non-conductive material, for example a glass or plastic material, and may include the conductive electrodes/traces comprising a touch sensitive element. The displacement element 3 may be transparent or opaque according to the application at hand. For example, in some implementations a display screen may be provided below the sensor element 6. In this case the displacement element 3 (and any parts of the frame element 2 overlying the display screen) should be transparent, at least to some extent, to allow a user to see the display screen through the sensor element 6. In other cases there may be a desire from a design perspective to hide what is behind the displacement element 3 (for example because there is internal wiring or structural elements of an apparatus in which the sensor element 6 is mounted which are not intended to be visible to the user for aesthetic reasons). In this case the displacement element 3 and/or frame element 2 may be opaque. In such cases, the displacement element 3 may include markings or other form of indicia representing certain functions associated with the device in which the sensing apparatus 1 is to be used, e.g., the letters of the alphabet at positions on the displacement element 3 corresponding to a conventional keyboard layout. It will be appreciated that the touch sensing function is not essential to the principles described herein, and in some embodiments, such as where the sensing device 1 is to be used as a simple displacement sensor (i.e. a switch), the displacement element 3 may not comprise a touch sensing apparatus.

FIG. 4 schematically represents the sensor element 6 in a displaced state in which the frame element 2 is undergoing a change of velocity (i.e. an acceleration). In the scenario shown in FIG. 4, mechanical perturbation of the frame element has induced acceleration, shown schematically by the arrow labelled "ACCELERATION" in FIG. 4. It will be appreciated that the direction and magnitude of the acceleration is arbitrarily shown in FIG. 4. Moreover, the nature and cause of the mechanical perturbation of the frame element 2 are not significant to the principles descried herein. Perturbation of the frame element 2 may in some instances be induced by handling and/or transportation of the sensing apparatus 1. For example, in some embodiments the sensing apparatus may be incorporated in a portable device (such as a tablet computer or mobile telephone) such that the frame element 2 is coupled mechanically to a part of the device (i.e. a housing), or forms an integral part of the device. In such embodiments, a movement of the portable device by the user, for instance during handling and/or moving whilst carrying the device, may induce an acceleration of the frame element 2. In other embodiments the sensing apparatus 1 may be integrated into a vehicle, wherein the motion of the frame element 2 may be coupled mechanically to one or more components of the vehicle, such that acceleration of the one or more components of the vehicle may induce an acceleration of the frame element 2.

With reference to FIG. 4, the schematic shows a scenario in which a change in displacement has occurred, as indicated by a change in separation distance between the displacement element 3 and the frame element 2, as a consequence of the acceleration of frame element 2. The frame element 2 and the displacement element 3 are mechanically coupled to each other via the support element 8 and the deformable electrode 5, such that forces may be transmitted between the frame element 2, the displacement element 3 and the support element 8. When frame element 2 is in a state of acceleration, force is transmitted from frame element 2 to both support element 8 and displacement element 3. As a consequence of the inertial mass of the displacement element 3 and the support element 8, inertial forces associated with displacement element 3 and support element 8 will resist a change in acceleration. Because the support element 8 is formed of a resilient material, there will be deformation of the shape of support element 8 under the action of the resultant force (load), enabling the displacement element 3 to move along a displacement direction towards the frame element 2 by an amount e. The amount e is referred to herein as the change in separation distance between the displacement element 3 and the frame element 2 or alternatively as the displacement of the displacement element 3 (note that the separation between the displacement element 3 and the frame element 2 is given by h-e). In the example shown in FIG. 4, the resulting force induces a compressive loading of the support element 8, indicated schematically by the bowing of the sides of the support element 8. However in other cases, the resulting force may induce tensile loading of the support element 8, which may cause an increase in the separation distance, h-e, between the displacement element 3 and the frame element 2 (in other words, the change in separation distance, e, can be positive or negative). In other cases, the acceleration of the frame element may induce shear loading of the support element 8. The change in separation distance, e, may depend on a variety of factors, including the magnitude and direction of the acceleration of the frame element 2, the inertial mass of the displacement element 3, the inertial mass of the support element 8, the resilience and geometry of the deformable electrode 5, and the resilience and geometry of the support element 8. In the present example, and with reference to FIG. 4, the change in separation distance e is positive in a direction toward the frame element 2, and negative in a direction away from the frame element 2.

Depending upon the configuration of the components within sensing apparatus 1 (and as described later, also the magnitude and direction of acceleration of the frame element 2), the change in separation distance, e, between the displacement element 3 and the frame element 2 may be associated with a measurement of the displacement sensor output which exceeds a threshold value at which a displacement is deemed to have occurred. This may occur in the absence of any force (load) being applied to the displacement element 3 by a user with the intention of making a displacement input to the sensing device 1 (i.e. a press). In such instances, an indication of displacement is considered to be the result of inertial effects associated with acceleration of the frame element 2 rather than the result of user input (i.e., the user pressing on the displacement element 3), and the detection of displacement may be considered a 'false positive'.

In order to discriminate against such 'false positives', in accordance with the principles of the present disclosure, the sensing apparatus 1 includes an acceleration sensing function. In this regard, the sensing apparatus 1 is configured to detect acceleration of the frame element 2 (or at least an acceleration proportional to the acceleration of the frame element 2), based on the effect of a change in velocity on the acceleration sensor element 9, shown schematically in FIGS. 1, 2, 3 and 4. The acceleration sensor element 9 may be based on any suitable design, and is electrically connected to the acceleration sensor element measurement circuitry 4C in the controller element 4, which is configured to measure acceleration of the acceleration sensor element 9. It will be appreciated to those skilled in the art there are many well-established techniques for sensing acceleration, including those based on capacitative, piezoresistive, electromagnetic, piezoelectric, ferroelectric and optical principles, and any suitable technique may be adopted to provide the acceleration sensing function of the acceleration sensor element 9. In this example, the acceleration sensor element 9 is mechanically coupled to the frame element 2, such that via transfer of force, acceleration of the frame element 2 induces a proportional acceleration of acceleration sensor element 9. This mechanical coupling may be achieved in accordance with any known techniques, including but not limited to adhesive bonding, mechanical fastening, and embedding of the acceleration sensor element 9 within the structure of the frame element 2. It will be appreciated that the design and placement of acceleration sensor element 9 in FIGS. 1 to 4 is illustrative, and the acceleration sensor element 9 may be disposed in any location with respect to the frame element 2, provided the coupling between acceleration sensor element 9 and frame element 2 enables an acceleration associated with the frame element 2 to be detected by acceleration sensor element 9. In some embodiments, the acceleration sensor element 9 may not be directly attached to frame element 2. For example, both frame element 2 and acceleration sensor element 9 may be mechanically coupled via an intermediate element, e.g., a resilient element or an element coupled to the frame element 2, which is capable of transmitting force between frame element 2 and acceleration sensor element 9. For example, if the sensing device is 1 is implemented in a vehicle, the frame element 2 and acceleration sensor element 9 may, for example, be mechanically coupled to a resilient chassis element, such that acceleration of the chassis element induces proportional acceleration in both the frame element 2 and the acceleration sensor element 9. The acceleration sensor element 9 need not be placed directly adjacent to the frame element 2, but may be mounted some distance away from the frame element 2, provided that ultimately, the acceleration sensor element 9 can detect an acceleration associated with (i.e., in some way proportional to) the acceleration of the frame element 2. In some instances, the sensing apparatus 1 will be integrally provided with the acceleration sensor element 9; however, in other cases, the acceleration sensor element 9 may be retrofit to the sensing apparatus 1. It will be appreciated that the specific placement and coupling method of the acceleration sensor element 9 with respect to frame element 2 will depend on the specific sensing technology adopted in a given embodiment, and the optimal spatial configuration of the various components within the sensing device 1.

As discussed above and schematically represented in FIG. 1, the controller element 4 comprises functional circuitry blocks comprising the displacement element capacitance measurement circuitry 4A, the touch element capacitance measurement circuitry 4B, the acceleration element measurement circuitry 4C, and the processing circuitry 4D. The controller element 4 thus comprises circuitry which is suitably configured/programmed to provide the functionality of these circuitry blocks as discussed herein using conventional programming/configuration techniques for capacitive and acceleration sensing applications. While the displacement element capacitance measurement circuitry 4A, touch element capacitance measurement circuitry 4B, acceleration measurement circuitry 4C, and processing circuitry 4D are schematically shown in FIG. 1 as separate elements for ease of representation, it will be appreciated that the functionality of these components can be provided in various different ways, for example using a single suitably programmed general purpose computer, or field programmable gate array, or suitably configured application-specific integrated circuit(s)/circuitry or using a plurality of discrete circuitry/processing elements for providing different elements of the desired functionality.

As described above, the present disclosure provides an apparatus configured to determine when the output from a displacement sensor should be considered to be the result of inertial effects, i.e. being caused by inertial forces within the sensing apparatus 1 associated with acceleration of the frame element 2, rather than the result of user input (or vice versa). Certain embodiments of the disclosure relate to approaches for using the output of an acceleration sensor to determine whether the output of a displacement sensor should be determined to be associated with inertial effects resulting from acceleration of a frame element instead of being associated with a user input.

Figure 5A:
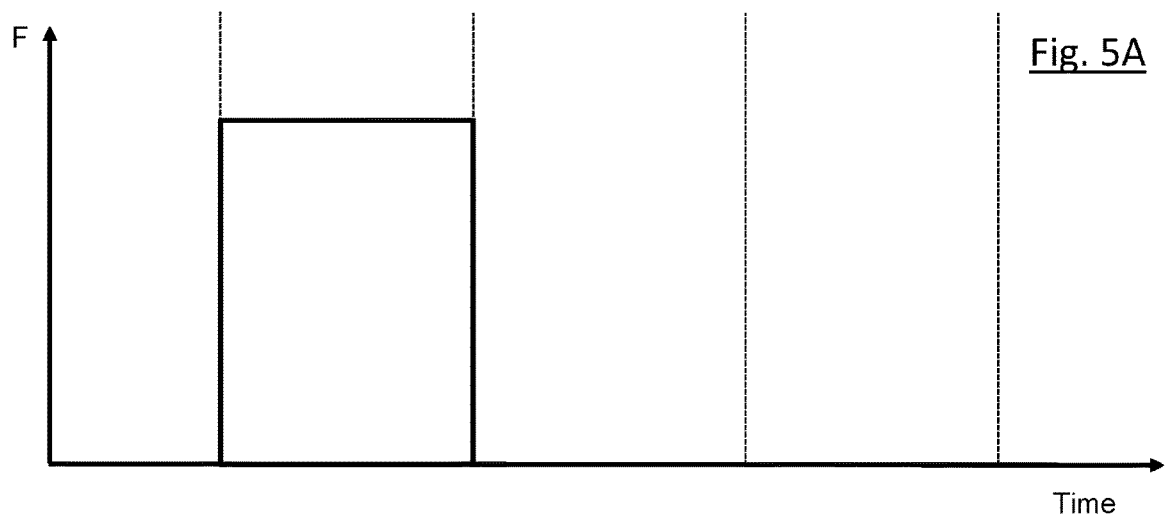
FIGS. 5A to 5E are graphs schematically representing some aspects of a known approach to detecting when a displacement occurs.
Figure 5B:
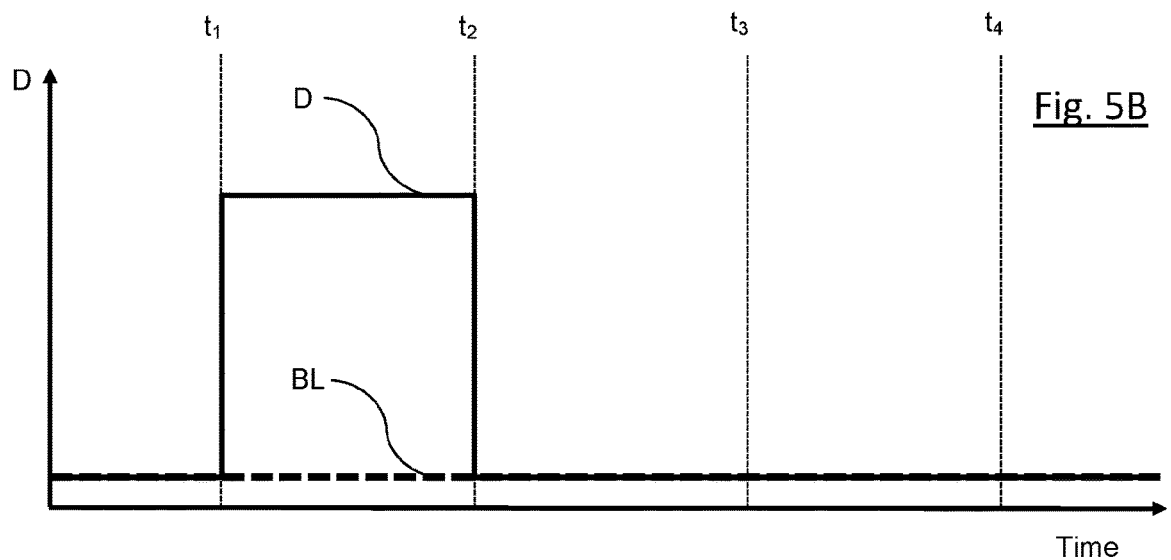
Figure 5C:
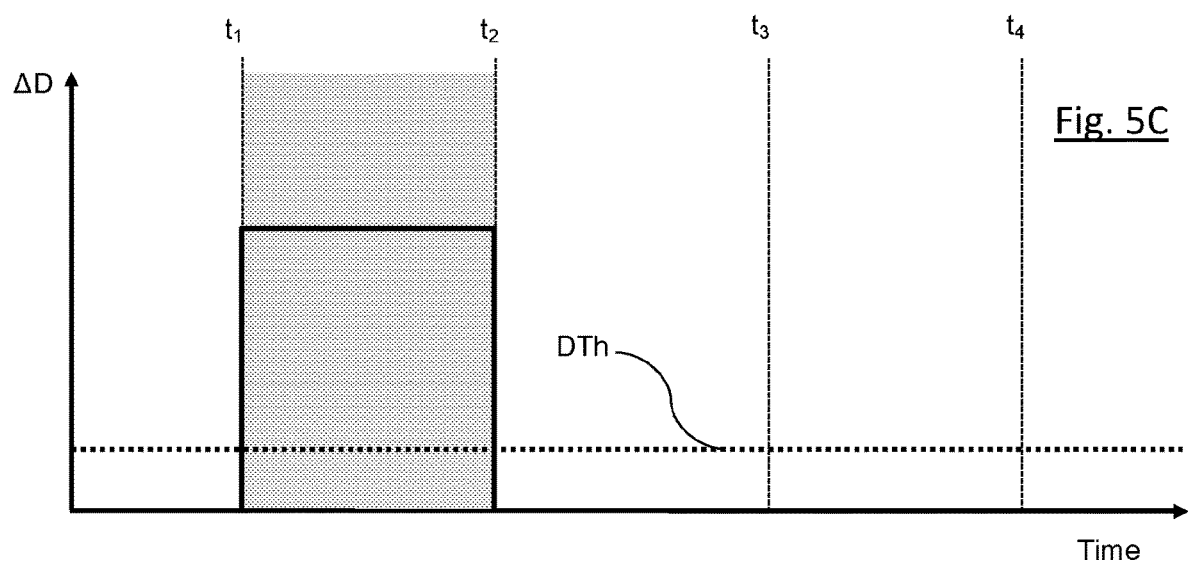

FIGS. 5A to 5C are graphs schematically showing a potential issue in using the output from a displacement sensor in isolation to indicate a user input (i.e. from a force applied by a finger or stylus) in situations where the frame element 2 may not be at rest. In this example it is assumed a user presses their finger (or a stylus) on a displacement element of a displacement sensor to apply a displacement load/force at time t1 and removes their finger (and hence the load/force) at time t2.

FIG. 5A is a graph schematically showing the force, F, (in arbitrary units) applied by a user's finger as a function of time during a press event to a sensing apparatus, such as apparatus 1 in FIGS. 1 to 4. Before the user presses on the displacement element 3 at time t1 there is no force applied by the user to the displacement element 3, between times t1 and t2 the user applies a steady force (as indicated by the horizontal line in FIG. 5A), and after the user removes their finger at time t2 there is again no force applied by the user. It will be appreciated FIG. 5A represents a somewhat idealised force profile and in practice the force applied by the user may be expected to vary slightly during the touch and to ramp up and ramp down less suddenly than shown in FIG. 5A. However, this is not significant to the principles described herein.

FIG. 5B is a graph schematically showing the displacement sensor output signal, D, (in arbitrary units) and a baseline displacement sensor output signal, BL, (in the same arbitrary units) for the displacement sensor output signal determined according to conventional techniques, as a function of time during the press on the displacement element represented by the force profile of FIG. 5A. As described above, the displacement sensor may be implemented using capacitive sensing techniques and thus the displacement output signal D may indicate a measured capacitance in such implementations. As the displacement element approaches the frame element (that is, the change in separation e increases), the strength of the capacitive coupling between electrodes 5 and 12 increases, and hence the displacement output signal D increases. The displacement sensor output signal D may be output from associated displacement element measurement circuitry (e.g. similar to displacement measurement circuitry 4A in the example apparatus of FIG. 4). In this example, the displacement sensor output signal D can be considered to represent the separation between the frame element and displacement element; that is, indicative of h-e. More specifically, as the change in separation e increases (in a positive direction), the value of the separation distance h-e decreases while the displacement sensor output signal D increases. Hence, the displacement sensor output signal D in this example is inversely proportional to separation distance h-e (note that proportional does not imply linearly proportional). The baseline displacement sensor output signal BL represents a value output by the associated displacement element measurement circuitry 4A absent any force applied by the user or any acceleration of the frame element 2. In an idealised scenario in which there is no movement of the displacement element 3 at all, the value of the baseline displacement sensor output signal BL corresponds to the separation distance of h. However, in practical applications, there may be slight variations in the separation distance h as a function of time caused e.g., by small amplitude vibrations or the like, and thus the baseline displacement sensor output signal BL can be thought of as an average measure of the separation distance h in the absence of any load. In FIG. 5B, this is shown as having a value offset from zero, although it should be appreciate that baseline displacement sensor output signal BL may be equal to zero. It will be appreciated that FIG. 5B represents a somewhat idealised displacement sensor output signal profile, and in practice the signal may be expected to vary slightly during the touch and to ramp up and ramp down less suddenly than shown in FIG. 5B. However, this is not significant to the principles described herein.

FIG. 5C is a graph schematically showing the difference, ΔD, (in arbitrary units) between the displacement sensor output signal, D, and the baseline displacement sensor output signal, BL, shown in FIG. 5B as a function of time. ΔD is representative therefore of the change in separation between frame element 2 and displacement element 3; that is, indicative of e. Also shown in FIG. 5C by a dashed horizontal line is a displacement detection threshold value DTh (sometimes referred to herein as a detection threshold value). This indicates the amount of measured displacement which is to be taken to correspond with a determination that a displacement is to be considered to have occurred. In this implementation, the level of this threshold may be set according to the application at hand, for example having regard to how the displacement sensor output signal changes with displacement and a desired level of displacement required to correspond with a determination there has been a user input. In general an appropriate threshold level may, for example, be determined through modelling or empirical testing.

The displacement element 3 of the displacement sensor is considered to be in a displaced state when the difference, ΔD, between the displacement sensor output signal, D, and the baseline displacement sensor output signal, BL, is equal to or exceeds the detection threshold value, DTh. For the example force profile represented in FIG. 5A, the period of time during which the difference, ΔD, (shown in FIG. 5C) between the displacement sensor output signal, D, and the baseline displacement sensor output signal, BL, exceeds the detection threshold value, DTh, is schematically represented in FIG. 5C by a shaded block. That is to say, the shaded area in FIG. 5C represents the period of time during which the sensing apparatus 1 determines there is a displacement in response to the force profile represented in FIG. 5A. The sensing apparatus may output an indication that a displacement is deemed to be present (i.e. a binary indication) or an indication of the magnitude of the measured displacement (e.g., based on the value of ΔD), depending on the implementation at hand.

In accordance with conventional techniques, the baseline, BL, represented in FIG. 5B may be determined by low-pass filtering (or otherwise smoothing/boxcar averaging) the displacement sensor output until it is initially determined the difference, ΔD, exceeds a threshold value (this threshold value may be referred to as a tracking threshold, and may, for example, be the same as the detection threshold or may be less than the detection threshold value). In one implementation, when it is initially determined the difference, ΔD, exceeds the tracking threshold, DTh, (i.e., around the time t1) the baseline value, BL, is frozen for so long as the difference, ΔD, remains above the threshold value. When the difference, ΔD, falls below the threshold value at the end of the press event (i.e. around the time t2), the baseline value is again determined by low-pass filtering the displacement sensor output. Alternatively, the timespan over which the baseline value is averaged may be significantly greater than the typical timespans over which the sensing apparatus 1 usually experiences a displacement of the displacement element 3, such that the effect of any given displacement does not significantly impact the calculated baseline value.

The inventors have recognised that sensing displacements based only on the approaches discussed above with reference to FIGS. 5A to 5C can lead to issues relating to inertial effects induced in certain components of the sensing apparatus 1 by acceleration of the frame element 2; specifically, the detection of displacement events caused by inertial effects rather than a user applied force. These are now discussed with relation to FIGS. 5D and 5E.

Figure 5D:
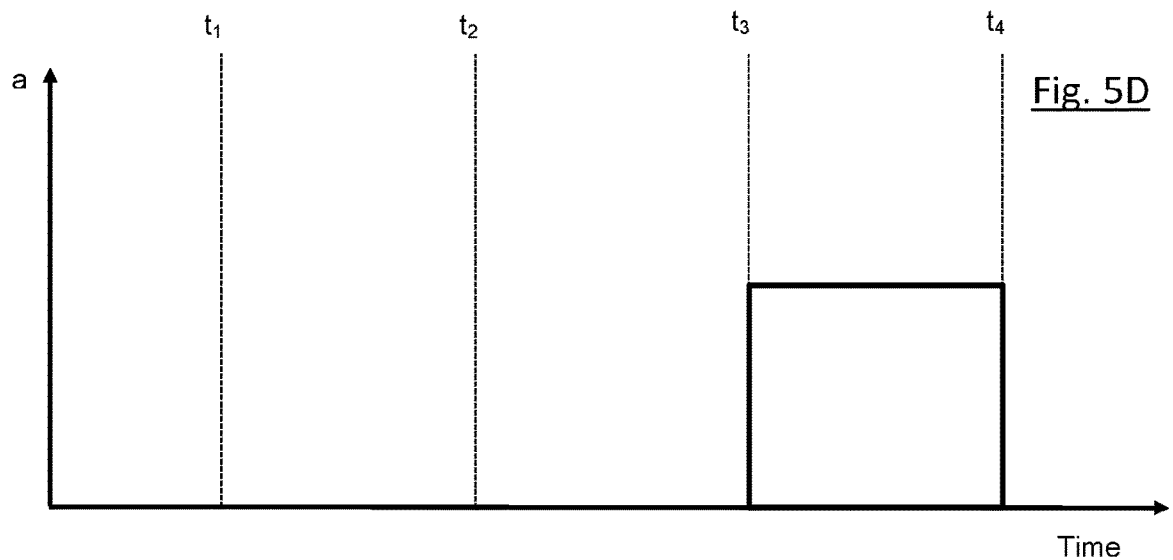

FIG. 5D is a graph schematically showing the magnitude of acceleration, a, (in arbitrary units) of the frame element 2 in response to a mechanical perturbation. As discussed above, such perturbations may be due to transport and/or handling of the sensing device 1, but it will be appreciated that the cause of perturbations is not fundamental to the principles described herein. In FIG. 5D, a period of constant acceleration is shown between time t3 and t4, and outside this period, the frame element 2 is considered to be at rest or in a state of constant velocity. It will be appreciated that FIG. 5D represents an idealised acceleration profile and in practice the acceleration of the frame element 2 may be expected to vary in profile and to ramp up and ramp down less suddenly than shown in FIG. 5D. However, this is not significant to the principles described herein.

Figure 5E:
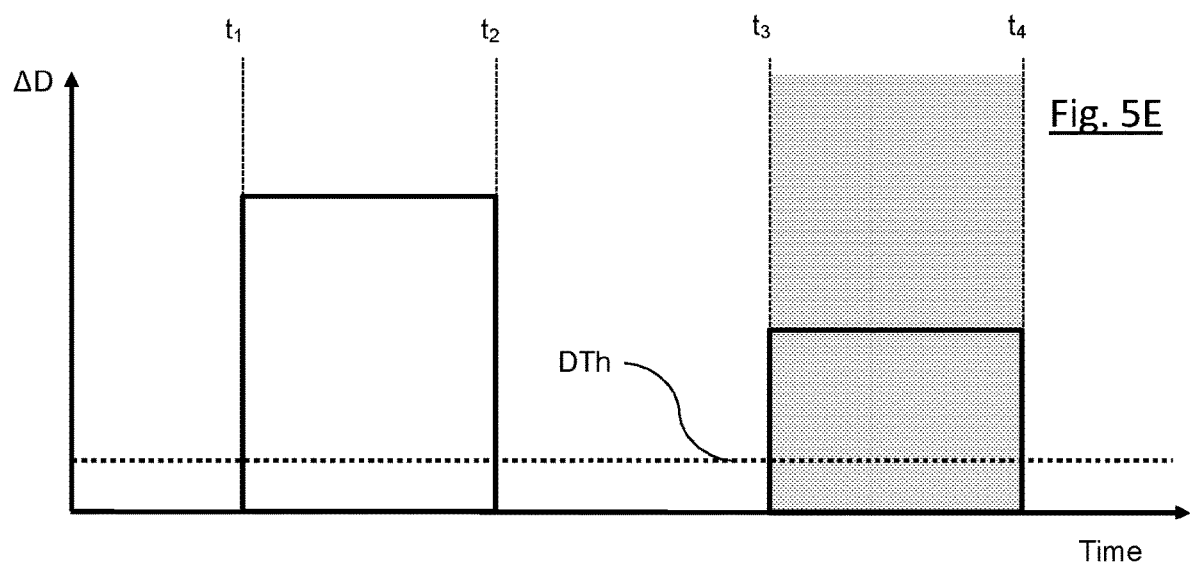

FIG. 5E will be understood from FIG. 5C, and is a graph schematically showing the difference, ΔD, between the displacement sensor output signal, D, and the baseline displacement sensor output signal, BL, (in the same arbitrary units) as a function of time during the input of force shown schematically in FIG. 5A (between time t1 and time t2) and the acceleration of the frame element 2 shown schematically in FIG. 5D (between time t3 and time t4). Also shown in FIG. 5D by a dashed horizontal line is a detection threshold value, DTh. Between time t1 and time t2, the difference, ΔD, between the displacement sensor output signal, D, and the baseline displacement sensor output signal, BL, exceeds the detection threshold value, DTh, as a result of the application of force by the user between time t1 and time t2 as shown schematically in FIG. 5A. Between time t3 and time t4, the difference, ΔD, between the displacement sensor output signal, D, and the baseline displacement sensor output signal, BL, exceeds the detection threshold value, DTh, as a result of inertial forces relating to the acceleration of the frame element 2 between time t3 and time t4 as shown schematically in FIG. 5D. As shown in FIG. 4, acceleration of the frame element 2 may cause a change in separation distance, e, between the displacement element and the frame element 2 due to deformation of the support element 8 and deformable electrode 5 in response to inertial forces resisting a change in velocity of support element 8, deformable electrode 5 and displacement element 3. A change in separation distance e causes the displacement sensor output signal D to change, and depending on the acceleration of the frame element 2, the corresponding value of the difference, ΔD, between the displacement sensor output signal, D, and the baseline displacement sensor output signal, BL, may exceed the detection threshold value, DTh. This is the scenario represented between time t3 and time t4 in FIG. 5E, wherein inertial effects associated with the acceleration of the frame element 2 shown schematically in FIG. 5D has caused a detection of displacement during the period of time indicated by the shaded box. The displacement detection in the period between time t3 and time t4 is not associated with an application of force by the user (with reference to FIG. 5A) and may be considered to be a 'false positive'.

To help address some of the issues resulting from approaches of the kind represented in FIGS. 5A to 5E, new approaches for sensing displacement and acceleration and processing output signals from a sensing apparatus comprising both a displacement sensor and an acceleration sensor are proposed.

In broad summary, certain implementations of the disclosure can discriminate against such 'false positives' using the output of an acceleration sensor in combination with the output of a displacement sensor to determine whether a measurement of displacement relates to inertial effects associated with acceleration of a frame element or an input of force to displacement element by a user. In particular, in a sensing apparatus having both a displacement sensor and an acceleration sensor, for example as discussed above with reference to FIGS. 1 to 4, the sensing apparatus may be configured to make use of the output from the acceleration sensor to discriminate between 'false positives' by compensating for changes in displacement caused partially or fully by the result of inertial effects (as opposed to user interaction).

In some implementations, the processing circuitry 4D of the sensing apparatus is configured to determine that displacement of the displacement element 3 caused by the user applying a force to the displacement element 3 occurs when an acceleration of the sensing apparatus (or more specifically the frame element 2) as measured by an acceleration sensing element 9 is equal to or below an acceleration threshold value.

For example, in accordance with certain implementations, during a period when the acceleration sensor output signal is equal to or exceeds a threshold (or where the difference between the acceleration sensor output signal and a baseline acceleration sensor output signal is in excess of a threshold value), any change in the separation distance between the displacement element 3 and the frame element 2 can be considered to arise from the acceleration of the frame element 2, and not from a user input. In one implementation, in such a case, the baseline displacement sensor output signal BL may be set to the value of the displacement sensor output signal itself (i.e. so the difference between them is forced to 0) during the period where the acceleration sensor output exceeds a threshold value, such that the difference between the displacement sensor output signal D and the baseline BL cannot exceed the threshold value used to indicate that the user has applied a force (load) to the displacement element 3. When the acceleration sensor determines the acceleration of the frame element 2 has dropped below a threshold value, the baseline displacement sensor output signal BL is no longer set to the value of the displacement sensor output signal D itself. Thus, in accordance with this approach, the sensing apparatus is in effect configured to allow a displacement to be detected when the acceleration sensor determines the magnitude of the acceleration of the frame element 2 is below a level that is known to be associated with false positive detections of displacement by the displacement sensor.

In other embodiments, the processing circuitry 4D may incorporate control logic configured to enable gating of binary input signals. For example, in some embodiments an indication of displacement may be represented within the processing circuitry as a first binary signal, where 1 (or another value) indicates that the displacement exceeds a threshold amount, and 0 (or another value) indicates that the displacement is below a threshold amount, and the indication of acceleration of the frame element may be represented within the processing circuitry as a second binary signal, where 1 indicates that the acceleration of the frame element exceeds a threshold amount, and 0 indicates that the acceleration of the frame element is below a threshold amount. In such embodiments, logic gates may be configured within the processing circuitry to output an indication that user has pressed the displacement element 3 if the first binary signal, indicating displacement state, has the value 1, and the second binary signal, indicating acceleration state, has the value 0.

Accordingly, in accordance with certain implementations a sensing apparatus may comprise a displacement sensor comprising capacitance measurement circuitry configured to provide a displacement sensor output signal indicative of a separation between a frame element and a displacement element movably mounted with respect to the frame element, and an acceleration sensor comprising acceleration measurement circuitry configured to provide an acceleration sensor output signal indicative of the acceleration of the frame element. A signal processing element for the sensing apparatus may be configured to output a detection signal to indicate there is determined to be a displacement of the displacement element relative to the frame element (i.e. a change in separation) caused by a user applying a force to the displacement element in response to determining that the acceleration of the frame element is below a threshold value and that a displacement sensor output signal exceeds a threshold (i.e. indicating that the separation between the two elements is less than or equal to a threshold value).

Figure 6A:
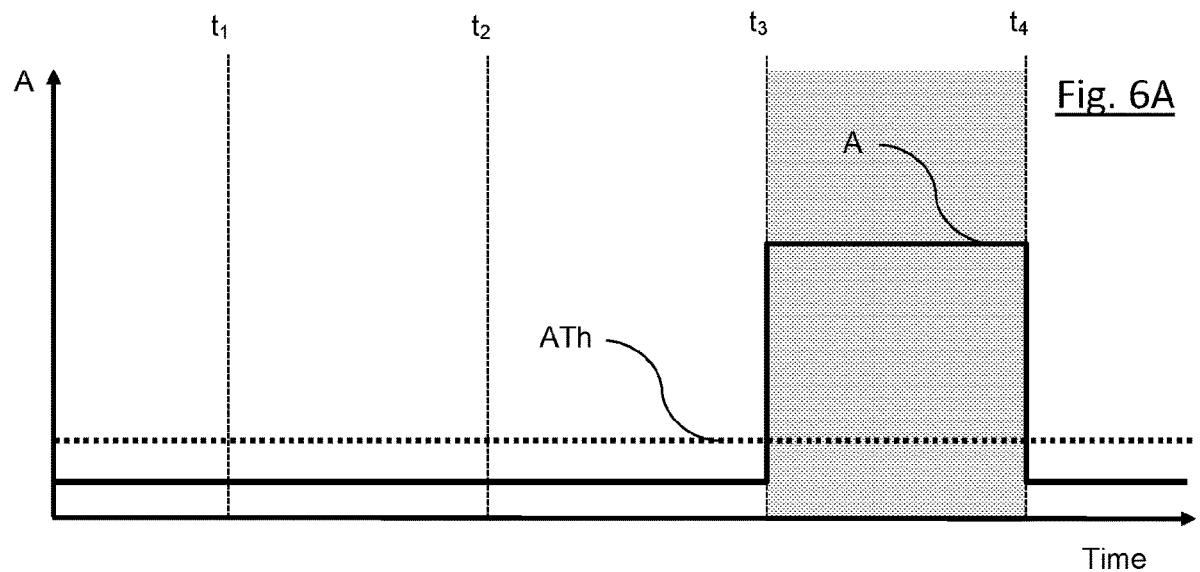
Figure 6B:
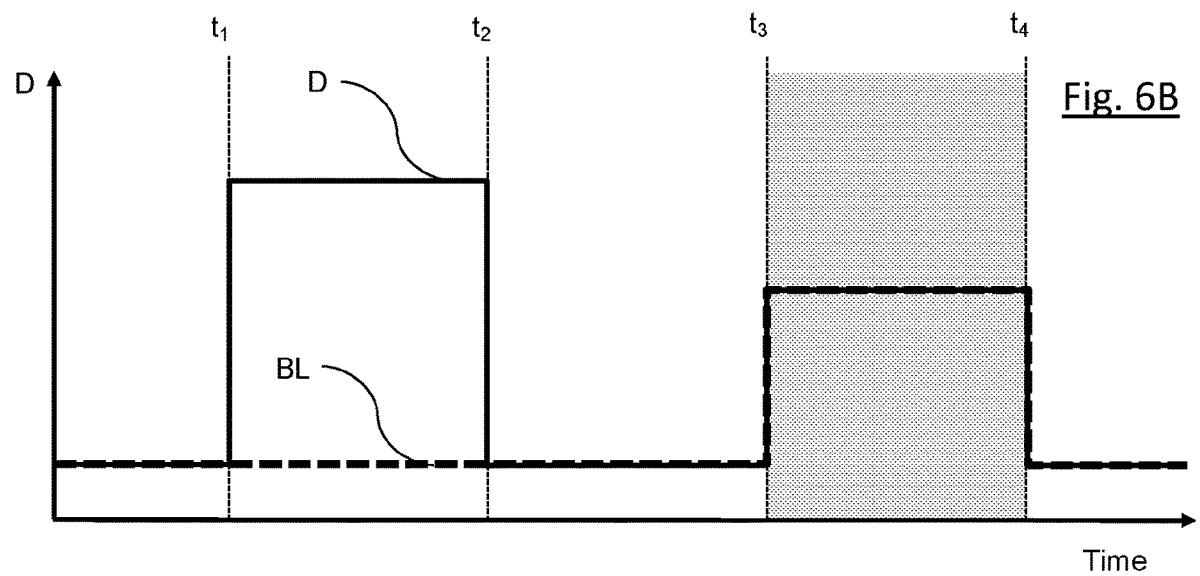

FIGS. 6A to 6C are graphs schematically showing an approach for determining when the output from the displacement sensor of the sensing apparatus 1 represented in FIGS. 1 to 4 should be considered a 'false positive', i.e. that a displacement measurement should be considered to represent a change in the separation distance between displacement element 3 and frame element 2 resulting from inertial effects associated with acceleration of the frame element 2, rather than due to an application of force upon the displacement element 3 by the user (i.e. a press). It is assumed here that a user presses their finger on displacement element 3 of the displacement sensor to apply a displacement load/force at time t1 and removes their finger (and hence the load/force) at time t2 (as shown schematically in FIG. 5A), and that the frame element 2 is subjected to a period of acceleration between time t3 and time t4 (as shown schematically in FIG. 5D).

FIG. 6A is a graph schematically showing the acceleration sensor output signal, A, (in arbitrary units) for the acceleration sensor element 9 determined according to conventional techniques against time, in response to the acceleration profile shown in FIG. 5D. As a consequence of the acceleration sensor element 9 sensing an acceleration of the frame element 2, the acceleration sensor output signal, A, can be considered to represent a measurement of the acceleration of the frame element 2. In other words, acceleration of the frame element 2 induces acceleration of the acceleration sensor element 9 which is substantially similar in both direction and magnitude. The level of the acceleration sensor output signal, A, is thus a function of the acceleration state of the frame element 2. Also shown in FIG. 6A by a dashed horizontal line is an acceleration detection threshold value ATh. The level of this threshold may be set according to the application at hand, for example having regard to how the acceleration sensor output signal, A, changes with the acceleration of frame element 2, and having regard to a level of acceleration in frame element 2 that is considered to be significant. In some embodiments, the acceleration threshold, ATh, may be defined as the magnitude of acceleration sensor element output that corresponds to a magnitude and direction of acceleration of frame element 2 associated with inertial effects that are known to result in detection of displacement by the displacement sensing apparatus comprising deformable electrode 5, reference electrode 12, displacement element capacitance measurement circuitry 4A and processing circuitry 4D. The acceleration threshold ATh may be set as a fixed value. For example, in some cases the level of the acceleration threshold, ATh, may be set to the value of the acceleration sensor output signal, A, that corresponds with the point at which the difference, ΔD, between the displacement sensor output signal D and the displacement sensor baseline signal BL is equal to the threshold value, DTh, indicating that a displacement should be considered to be detected. A suitable acceleration sensor output threshold, ATh, may be selected based on modelling or empirical testing, for example. The magnitude of the acceleration sensor output signal, A, which corresponds to a detection of displacement may depend upon the type or design of acceleration sensor element used, acceleration sensor element operating principle, the mechanical coupling between the acceleration sensor element 9 and the frame element 2, and the orientation of the acceleration sensor element 9. It will be appreciated that FIG. 6A represents an idealised acceleration sensor output signal profile and in practice the signal may be expected to vary in profile and to ramp up and ramp down less suddenly than shown in FIG. 6A. However, this is not significant to the principles described herein. It should be appreciated that, in other implementations, the acceleration threshold ATh may be a variable threshold. For example, the value ATh may be set relative to an average acceleration over a defined period of time.

For the example acceleration profile represented in FIG. 6A, the period of time during which the acceleration sensor output signal, A, exceeds the detection threshold value, ATh, is schematically represented in FIG. 6A by a shaded block. In this example, the acceleration sensor output signal A exceeds the detection threshold value ATh during the period between time t3 and time t4. That is to say, the shaded area in FIG. 6A represents the period of time during which the sensing apparatus 1 determines there is an acceleration of the frame element 2 equal to, or in excess of, a certain value of acceleration.

FIG. 6B is a graph schematically showing an approach for gating of the displacement sensor element output signal, D, using the acceleration sensor output, A (shown in FIG. 6A). During periods of time for which the acceleration sensor output (shown in FIG. 6A) is in excess of the acceleration threshold value, ATh, the baseline displacement sensor output signal, BL, in FIG. 6B is set to the value of the displacement sensor output signal itself (i.e. so the difference between them is forced to 0). Alternatively, the baseline displacement sensor output signal itself may not be altered, but any input of the baseline displacement sensor output signal BL (e.g., to the processing circuitry 4D) may be replaced by the displacement sensor output signal D—that is, the input BL may be replaced with an input of D during periods where the acceleration sensor output A is greater than or equal to the acceleration threshold value ATh. In FIG. 6B, the period of time for which the acceleration sensor output, A, is in excess of the acceleration threshold value, ATh, is indicated by a shaded block. In other words, the region indicated by the shaded block indicates the period of time during which the baseline displacement sensor output signal, BL, in FIG. 6B is set to the value of the displacement sensor output signal itself (i.e. from around time t3 to around time t4). Between time t1 and time t2, where the acceleration sensor output difference profile is below the acceleration threshold value (as shown in FIG. 6A), the baseline displacement sensor output signal BL is not gated using the output of the acceleration sensor.

FIG. 6C, which will be understood from FIG. 6B, shows the difference, ΔD, (in arbitrary units) between the displacement sensor output signal, D and the baseline displacement sensor output signal, BL, for the profile shown in FIG. 6B as a function of time. Also shown in FIG. 6C by a dashed horizontal line is a displacement detection threshold value, DTh. As in FIG. 5C, this displacement detection threshold value DTh indicates the magnitude of measured displacement which is to be considered to correspond with a determination that a displacement has occurred. As a result of the gating of the baseline displacement sensor output signal in FIG. 6B using the acceleration sensor output shown schematically in FIG. 6A, the difference, ΔD, is fixed below the displacement detection threshold value DTh during the time period between time t3 and time t4, i.e. during the time period when acceleration of the frame element 2 was detected in FIG. 6A. This has the result of suppressing the 'false positive' detection due to inertial effects (i.e. related to apparatus acceleration) that would otherwise have occurred (as shown, for example, in FIG. 5E). The period between time t1 and time t2, which corresponds to a period of force (load) input by the user on displacement element 3 (and which corresponds to an absence of measured acceleration exceeding the acceleration threshold value, ATh) in FIG. 6A remains ungated. The period between time t1 and time t2 which is considered to correspond to a detection of displacement resulting from input of force (load) upon the displacement element 3 by the user, is indicated by a shaded box in FIG. 6C.

In accordance with embodiments of the disclosure, and as discussed above, the baseline displacement sensor output, BL, represented in FIG. 6B is determined by setting the baseline value to the displacement sensor output signal D whenever the acceleration sensor determines the acceleration of the frame element 2 exceeds a threshold value. This may be based on taking the acceleration sensor output signal, A, and comparing it with an acceleration sensor detection threshold, ATh, as discussed above with reference to FIG. 6A. This means the difference, ΔD, between the displacement sensor output signal and the displacement sensor baseline value represented in FIG. 6C is forced to 0 for the period during which the acceleration sensor reports the acceleration of the frame element 2 exceeds a threshold value. At time t3 the acceleration sensor reports the acceleration of the frame element 2 exceeds the detection threshold. In response the displacement sensor baseline BL is set to the displacement sensor output signal (i.e. the baseline BL begins tracking the displacement sensor output signal D). Consequently, this in effect forces the difference between the displacement sensor output signal and the displacement sensor baseline to 0, which of course is below the displacement detection threshold DTh, thereby resulting in a determination that displacement is not detected. When the acceleration sensor reports that the acceleration of the frame element 2 has dropped below the threshold value (i.e. at time t4), the processing circuitry 4D may, in some embodiments, set the displacement sensor baseline value to the most recent displacement sensor output signal value seen before the acceleration was detected by the acceleration sensor (i.e. at time t3). Thus, it will be appreciated this approach in which the displacement sensor output is in effect qualified by the acceleration sensor output allows the sensing apparatus to more precisely distinguish between displacement resulting from user inputs of force (load) on displacement element 3 and displacements associated with inertial effects associated with acceleration of the frame element 2.

It will be appreciated that while the above-described approaches have included examples of how to process the output of an acceleration sensor to gate the output of a displacement sensor, in some implementations it may be necessary to include a delay at the end of the gating period. For example, in some embodiments the output signal of the displacement sensor may decay more slowly than the output signal of the acceleration sensor, such that subsequent to a change in separation of the frame and displacement elements that is the result of acceleration of the frame element 2, the acceleration sensor output will drop below the threshold value used for detection of acceleration, ATh, during a time period in which the difference, ΔD, between the displacement sensor output signal and the displacement sensor baseline value remains above the threshold value, DTh, used for detection of displacement. In such an instance, the gating period defined by the output of the acceleration sensor may finish whilst a displacement is still being detected by the displacement sensor. Thus, in some embodiments, a delay time may be added to the gating period (in effect to offset the acceleration sensor output A and the displacement sensor output D), whereby the gating period is extended by a certain time following the point at which the acceleration sensor output drops below the threshold value. In some cases, this delay time may be set based on known decay times for the displacement and acceleration sensor outputs, determined, for example, by empirical testing or modelling.

Figure 7:
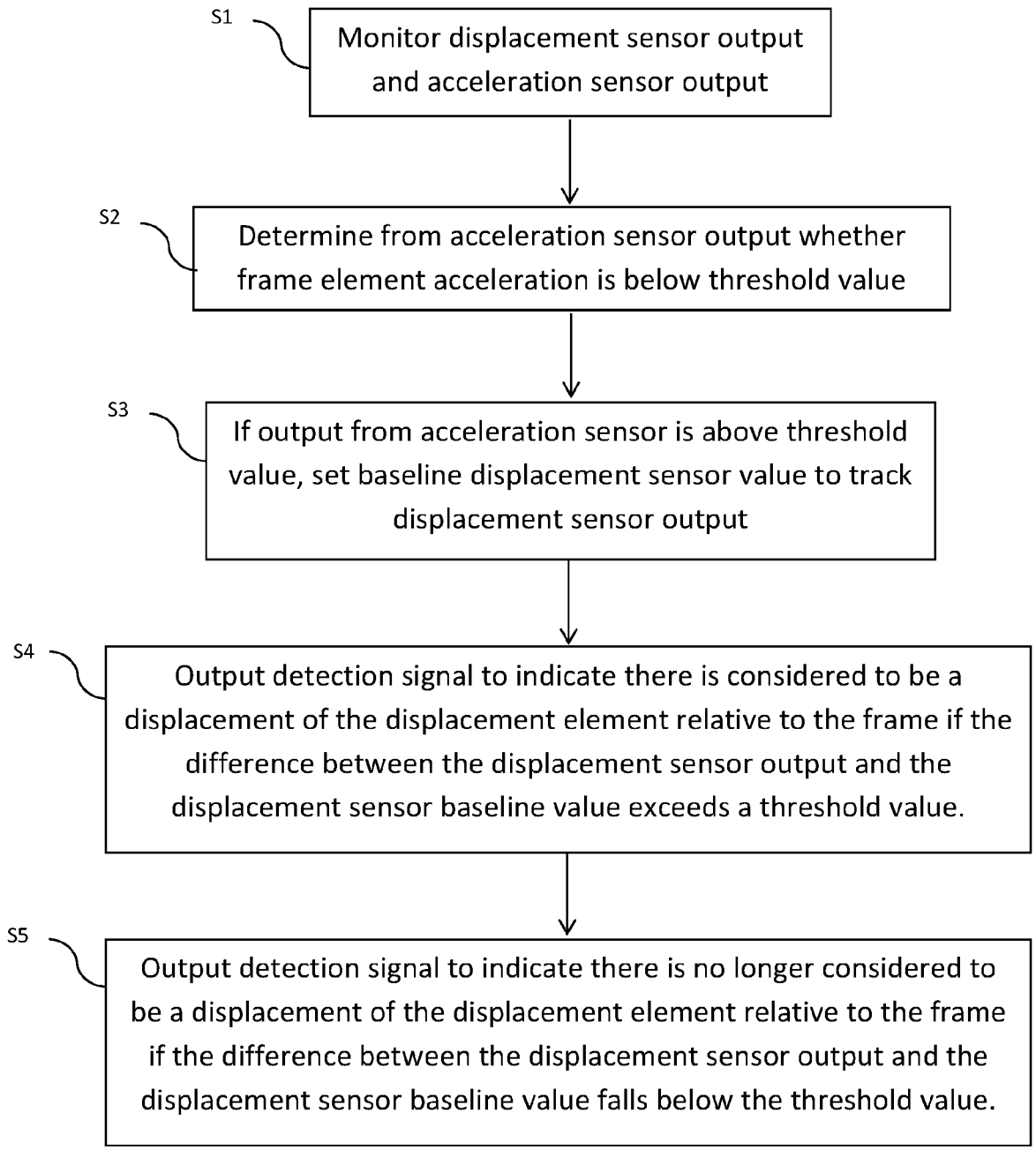
FIG. 7 is a flow chart schematically representing steps in an approach to detecting when a displacement occurs using the sensing apparatus of FIGS. 1 to 4 in accordance with certain embodiments of the disclosure.

FIG. 7 is a flow diagram representing some of the steps performed by the processing circuitry 4D of the control unit 4 for the sensing apparatus 1 to implement the approach discussed above with reference to FIGS. 6A to 6C.

As schematically indicated in step S1, the processing circuitry 4D monitors the outputs from the displacement sensor (received from the displacement sensor measurement circuitry 4A) and the acceleration sensor (received from the acceleration sensor measurement circuitry 4C). Although step S1 is shown as a discrete step in FIG. 7, it should be appreciated that the monitoring of the displacement sensor output signal and the acceleration sensor output signal may occur continuously or periodically during use of the sensing apparatus 1.

In step S2 the processing circuitry 4D determines from the acceleration sensor output signal whether acceleration of the frame element 2 is equal to, or exceeds, a threshold level that is known to correspond to detection of displacement by the displacement sensor (i.e., ATh).

In step S3 the processing circuitry 4D determines a displacement sensor baseline value to use. As discussed elsewhere herein, the baseline value may begin to track the value output by the displacement sensor (i.e. the displacement sensor output signal value) if the acceleration sensor output is equal to or in excess of a threshold value, or, if the displacement sensor output exceeds the detection threshold in the absence of a detected acceleration by the acceleration sensor, the baseline value may be set to the displacement sensor output signal value immediately prior to the detection of displacement.

In step S4 the processing circuitry determines whether or not a difference between the displacement sensor output signal value and the displacement sensor baseline value determined in step S3 exceeds a predefined threshold value, and if so, outputs a signal to indicate there is considered to be a displacement of the displacement element relative to the frame element. This output signal may then be used by a host apparatus (e.g. a mobile telephone) in which the sensing apparatus is incorporated to respond accordingly depending on the corresponding functionality of the apparatus in which the sensing apparatus included. It will be appreciated the manner in which the host apparatus is configured to react to a determination that a displacement is detected (e.g. a user has pressed the displacement element) is not significant to the principles described herein.

In step S5 the processing circuitry is configured to output a detection signal which indicates there is no longer considered to be a displacement of the displacement element if the difference between the displacement sensor output signal value and the displacement sensor baseline value determined in step S3 falls below the predefined threshold value (i.e. (i.e. because the separation between the frame element and displacement element is greater than a threshold value)

It will be appreciated there are various modifications that can be applied to the above-described approaches.

For example, in the above described approaches it is assumed the displacement sensor baseline value is configured to track the displacement sensor output signal when the acceleration sensor output is in excess of a threshold level, and so the difference between them is forced to 0 such that the difference, $\Delta D$, cannot exceed the displacement sensor detection threshold, DTh, whilst the acceleration state of frame element 2 is such that false positive detection of displacement due to inertial effects might occur. However, it will be appreciated the same results can be achieved with different specific implementations. For example, whereas in some implementations the processing circuitry 4D may be configured to continually determine whether the difference between the displacement sensor output signal value and baseline displacement sensor output signal value exceeds the pre-determined threshold to indicate a displacement has occurred on an ongoing basis, in other implementations the processing circuitry may be configured not to perform this comparison when the acceleration sensor output is in excess of a threshold value, since in these conditions the difference is forced to 0 and cannot exceed the threshold value.

While it has generally been described above that the difference between a displacement sensor output signal D and a baseline displacement sensor output signal BL would be above a threshold DTh in order for displacement to be detected, it should be appreciated that any method used to establish displacement of the displacement element 3 may be employed in accordance with the principles of the present disclosure. However, in principle, it is the separation distance between displacement element 3 and the frame element 2 that is smaller than or equal to a separation distance threshold. In this case, when the separation distance h-e is less than or equal to the separation distance threshold, this signifies that the displacement element 3 moves towards (e.g., pressed by a user) the frame element 2. In essence, the precise way in which displacement is determined is not significant to the present disclosure, but is instead the use of an acceleration sensor to discriminate between displacement events that correspond to a user pressing the displacement element against displacement events that correspond to acceleration of the frame element 2.

It should also be appreciated that displacement sensing mechanisms may also be employed to distinguish between positive and negative displacement of the displacement element 3 (that is, where e is positive or negative). For instance, in some examples, two thresholds may be employed; one for displacement in the positive direction and one for displacement in the negative direction. The thresholds may have the same or different absolute values depending upon the application at hand. For example, the threshold for detecting displacement in the negative direction may be set relatively higher than that for detecting displacement in the negative direction as, in many applications, such displacement will not be caused by user interaction with the displacement element 3 but more likely will be caused by inertial effects. Hence, the processing circuitry 4D is configured to effectively ignore displacements in the negative direction in such implementations.

It should also be appreciated that the above generally describes comparing the absolute value of the acceleration to an acceleration threshold. However, it should be appreciated that in other implementations, positive and negative accelerations may be treated differently. For example, a negative acceleration may generally mean that the displacement element 3 is displaced in a direction away from the frame element 2, which may represent an action that the user generally would not perform in normal use of the sensing apparatus. In this instance, a second acceleration threshold (e.g., set at 0, for example) may be used to process negative accelerations. In this case, the processing circuitry 4D may first be configured to determine if the acceleration is positive or negative, and if positive compare the absolute value of the acceleration to a first acceleration threshold (as generally described above), and if negative, compare the absolute value of the acceleration to a second threshold. In this case, if the absolute value of the negative acceleration is less than the threshold (i.e., less than zero), then displacement of the displacement element by a user is deemed to occur. In this case, setting the threshold to zero effectively filters out all negative accelerations.

It should also be appreciated that the above has focused on using a gated approach to identify when an acceleration of the frame element 2 is greater than or equal to an acceleration threshold and uses this to determine whether a change in displacement can be attributed to a user applied force (to the displacement element) or through inertial effects. However, more generally, the sensing apparatus is configured to output a signal indicative of a change in separation (between the frame element 2 and the displacement element 3) resulting from a user applied force based on a measurement indicative of the separation (e.g., the change in separation e) and based on the measurement of acceleration.

Figure 8A:
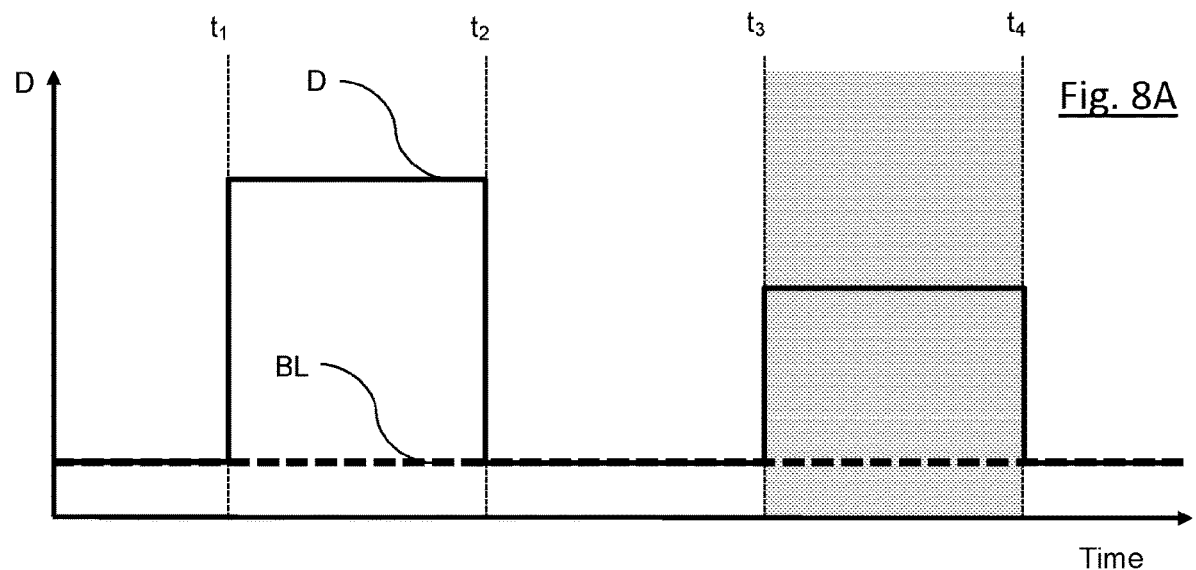
Figure 8B:
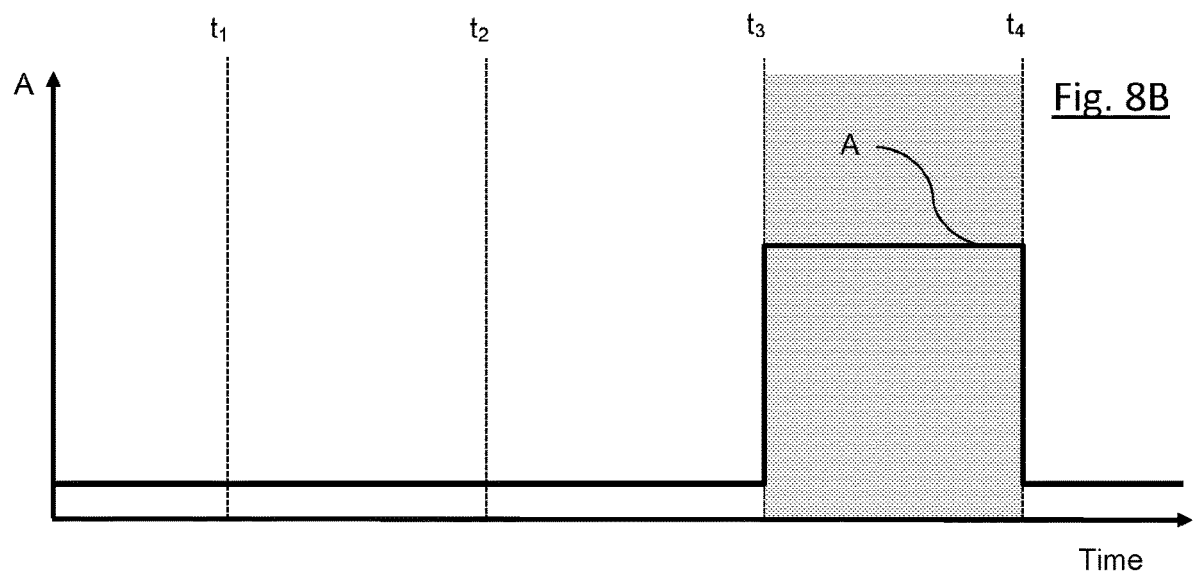

FIGS. 8A to 8C represent an alternative implementation of the processing performed by the sensing apparatus 1 when determining whether or not to output a signal indicative of indicative of a change in separation between the frame element 2 and the displacement element 3.

FIG. 8A is a graph schematically showing the displacement sensor output signal, D, (in arbitrary units) and a baseline displacement sensor output signal, BL, (in the same arbitrary units) for the displacement sensor output signal D determined according to the techniques described above, as a function of time. The signal D includes a region between times t1 and t2 (first peak) and between times t3 and t4 (second peak) where the displacement sensor output signal D is greater than the baseline displacement sensor output signal BL. FIG. 8B schematically shows the acceleration sensor output signal, A, (in arbitrary units) for the acceleration sensor element 9 determined according to conventional techniques against time for the corresponding time period. From the above, the first peak (i.e. between t1 and t2) corresponds to a displacement of the displacement element 3 arising from a force applied by a user to the displacement element (as there is no corresponding acceleration of the frame element 2 between t1 and t2) while the second peak (i.e. between t3 and t4) corresponds to a displacement of the displacement element 3 arising at least partially from inertial effects (as there is a corresponding acceleration of the frame element between t3 and t4). As above, it should be appreciated that the displacement sensor output signal D and the acceleration sensor output signal A represent somewhat idealised displacement sensor output signal profile and an acceleration sensor output signal profile respectively, and in practice the signals may be expected to vary slightly during the touch and to ramp up and ramp down less suddenly than shown in FIGS. 8A and 8B. However, this is not significant to the principles described herein.

FIG. 8C schematically represents the difference, $\Delta D$, (in arbitrary units) between the displacement sensor output signal, D and the baseline displacement sensor output signal, BL, for the profile shown in FIG. 8A as a function of time. Also shown in FIG. 8C by a dashed horizontal line is a displacement detection threshold value, DTh. As in FIGS. 5C and 6C, this displacement detection threshold value DTh indicates the magnitude of measured displacement which is to be considered to correspond with a determination that a displacement has occurred.

However, unlike in FIGS. 5C and 6C, the displacement detection threshold value DTh is variable. More specifically, the displacement detection threshold value DTh varies in response to the acceleration sensor element output signal. The displacement detection threshold value DTh may be calculated by the processing circuitry 4D. For example, the displacement detection threshold value DTh may be calculated using the following formula: $DTh=DTh0+\alpha A$, where DTh0 is an initial value, a is a coefficient of proportionality, and A is the acceleration sensor output signal. The initial value DTh0 and the coefficient of proportionality a may be determined empirically or through suitable modelling techniques. Equally, it should be appreciated that the above formula is representative only and the actual way in which the sensing apparatus responds to acceleration may differ depending upon the specifics of the sensing apparatus (that is, the relationship may not be linear). Again, this relationship may be determined empirically or through suitable modelling techniques.

Hence, in the example shown in FIG. 8C, during the period up to t3, and after t4, a relatively small value of acceleration is detected/sensed (essentially the baseline value of the acceleration sensor), and so the displacement detection threshold DTh is relatively low (e.g., it takes a value approximately equal to DTh0). Conversely, in the case where the magnitude of acceleration is relatively high, the displacement detection threshold DTh is relatively high. As before, when the difference $\Delta D$ is equal to or exceeds the displacement detection threshold value DTh, the processing circuitry 4D is configured to output the signal indicating a change in separation between the frame element 2 and the displacement element 3. In the period t1 to t2, the displacement detection threshold value DTh is relatively low and so the difference $\Delta D$ (which arises due to a user applying a force to the displacement element 3) exceeds the value DTh. However, in the period between t3 and t4, the threshold value DTh is relatively larger due to the influence of the sensed acceleration and thus the displacement $\Delta D$ in this period (which arises at least partly as a result of inertial effects) is not sufficient to trigger the processing circuitry 4D to output the signal indicative of a change in separation. Hence, in this implementation, the threshold used to determine whether displacement (or a change in separation) has occurred is calculated on the basis of the output of the acceleration sensor.

It should be appreciated that in this implementation, the processing circuitry 4D may be able to register touches applied by the user even if the sensing apparatus (or frame element 2 thereof) is undergoing changes in acceleration. For example, in the period t3 to t4, if the user applies a touch to the displacement element 3, thereby increasing the magnitude of the displacement sensor output signal D between t3 to t4, in some circumstances, the difference $\Delta D$ will surpass the threshold DTh even if there is some acceleration. This may be particularly useful in certain applications, e.g., for vehicles travelling on rough roads in which the user may press the displacement element 3 when the sensing apparatus experiences changes in acceleration.

Additionally, it should be appreciated that in some implementations the acceleration sensor element 9 may be configured to output an acceleration sensor output signal A that is dependent on the direction of the acceleration (e.g., an acceleration in one direction may be considered positive while an acceleration in the opposite direction may be considered negative; the way in which this is set may be dependent upon the geometry/orientation of the sensing apparatus 1 and the acceleration sensor element 9). In this scenario, the threshold DTh may, in some cases, be smaller than the initial value DTh0 (and may also be negative). This is particularly useful when the difference $\Delta D$ is not an absolute difference and thus considers which direction the change in separation is along.

It should also be appreciated that the techniques described in association with the implementation described in FIGS. 6A to 6C may equally be applied to the techniques described in FIGS. 8A to 8C. That is, the displacement detection threshold value DTh may be adjusted from a nominal threshold once the acceleration sensor output signal A surpasses an acceleration threshold (e.g., ATh).

Although it has been described above that the displacement detection threshold value DTh may be adjusted based on the acceleration sensor output signal A, it should be appreciated that the acceleration sensor output signal can instead be used to adjust the displacement sensor output signal D (or indeed the difference $\Delta D$). For example, the processing circuitry 4D may be configured to apply a correction amount to the displacement sensor output signal D to effectively form a corrected displacement sensor output signal D'. In a broadly similar way to that described above, the displacement sensor output signal D' may be calculated using the following formula: $D'=D+\beta A$, where $\beta$ is a coefficient of proportionality (which may be equal to or different from a described above). The detection threshold, DTh, may be a fixed value (e.g., as described with regards to FIG. 6C) and thus as the acceleration changes, so too does the corrected displacement sensor output signal D'. For example, if the magnitude of the acceleration sensor output signal A increases (and assuming $\beta$ is negative in this case), then the corrected displacement sensor output signal D' will be smaller than the displacement sensor output signal D, and may fall below the detection threshold value DTh (thus signifying no displacement has been detected). This implementation uses the principles described above but in relation to adjusting the displacement sensor output signal D as opposed to the detection threshold value DTh. However, it should be appreciated that a combination of these approaches may be used in some applications.

Thus there has been described sensing apparatus comprising: a displacement sensor element arranged to sense a separation between a first element and a second element movably mounted with respect to the first element; an acceleration sensor element configured to sense an acceleration associated with the first element; displacement measurement circuitry configured to make a measurement indicative of separation on the basis of the sensed separation; acceleration measurement circuitry configured to make a measurement of acceleration on the basis of the sensed acceleration; and a processing element configured to output a signal to indicate there is determined to be a change in the separation of the second element relative to the first element on the basis of the measurement indicative of separation and the measurement of acceleration.

Further particular and preferred aspects of the present invention are set out in the accompanying independent and dependent claims. It will be appreciated that features of the dependent claims may be combined with features of the independent claims in combinations other than those explicitly set out in the claims.

REFERENCES

[1] Capacitive Sensors: Design and Applications by Larry K. Baxter, August 1996, Wiley-IEEE Press, ISBN: 978-0-7803-5351-0

The invention claimed is:

1. A sensing apparatus comprising: a displacement sensor element arranged to sense a separation between a first element and a second element movably mounted with respect to the first element; an acceleration sensor element configured to sense an acceleration associated with the first element; displacement measurement circuitry configured to make a measurement indicative of separation on the basis of the sensed separation; acceleration measurement circuitry configured to make a measurement of acceleration on the basis of the sensed acceleration; and processing circuitry configured to output a signal to indicate there is determined to be a change in the separation of the second element relative to the first element on the basis of the measurement indicative of separation and the measurement of acceleration; wherein the processing circuitry is configured to output the signal to indicate there is determined to be a change in the separation of the second element relative to the first element when the measurement of acceleration is determined to be less than or equal to an acceleration threshold value.

2. The sensing apparatus of claim 1, wherein the processing circuitry is configured to compare the measurement indicative of separation to a detection threshold value and, to output the signal to indicate there is determined to be a change in the separation of the second element relative to the first element on the basis of the comparison.

3. The sensing apparatus of claim 2, wherein the processing circuitry is configured to output the signal to indicate there is determined to be a change in the separation of the second element relative to the first element when the measurement indicative of separation is less than or equal to the detection threshold value.

4. The sensing apparatus of claim 2, wherein one or both of the detection threshold value is determined on the basis of the measurement of acceleration, and the measurement indicative of separation is adjusted based on the measurement of acceleration.

5. The sensing apparatus of claim 1, wherein the measurement indicative of separation is determined by calculating the difference between the displacement sensor element output signal and a reference value.

6. The sensing apparatus of claim 5, wherein the reference value is an average value determined based on the separation between the first element and the second element over a predetermined time period.

7. The sensing apparatus of claim 5, wherein the reference value is set to the current value for the displacement sensor element output signal when the measurement of acceleration is greater than or equal to the acceleration threshold value.

8. The sensing apparatus of claim 1, wherein the processing circuitry is further configured to indicate there is no longer determined to be a displacement of the second element relative to the first element.

9. The sensing apparatus of claim 1, wherein the signal to indicate there is determined to be a change in the separation of the second element relative to the first element output by the processing circuitry is indicative of the magnitude of separation between the first and second element.

10. The sensing apparatus of claim 1, wherein the processing circuitry is configured to offset the measurement of acceleration by a predetermined amount of time, and wherein the processing circuitry is configured to output the signal to indicate there is determined to be a change in the separation of the second element relative to the first element on the basis of the measurement of separation and the offset measurement of acceleration.

11. The sensing apparatus of claim 1, wherein the acceleration sensor element is mechanically coupled to the first element.

12. The sensing apparatus of claim 1, wherein the second element comprises a touch sensor element configured to sense at least the presence of an object adjacent the second element.

13. An apparatus comprising the sensing apparatus of claim 1.

14. A method for determining when displacement occurs in a sensing apparatus comprising a first element and a second element movably mounted with respect to the first element, the method comprising: sensing a separation between the first element and the second element; making a measurement indicative of a separation on the basis of the sensed separation; sensing an acceleration of the sensing apparatus; making a measurement of an acceleration on the basis of the sensed acceleration; and outputting a signal to indicate there is determined to be a change in the separation of the second element relative to the first element on the basis of the measurement indicative of separation and the measurement of acceleration; wherein outputting a signal to indicate there is determined to be a change in the separation of the second element relative to the first element includes outputting the signal to indicate there is determined to be a change in the separation of the second element relative to the first element when the measurement of acceleration is determined to be less than or equal to an acceleration threshold value.

* * * * *